(12) United States Patent
Fang et al.

(10) Patent No.: US 9,564,530 B2
(45) Date of Patent: Feb. 7, 2017

(54) INTEGRATED CIRCUIT STRUCTURE AND METHOD WITH SOLID PHASE DIFFUSION

(71) Applicant: Taiwan Semiconductor Manufacturing Company, Ltd., Hsin-Chu (TW)

(72) Inventors: Ziwei Fang, Hsinchu (TW); Tsan-Chun Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/312,166

(22) Filed: Jun. 23, 2014

(65) Prior Publication Data

US 2015/0372144 A1 Dec. 24, 2015

(51) Int. Cl.
| | |
|---|---|
| *H01L 29/78* | (2006.01) |
| *H01L 29/36* | (2006.01) |
| *H01L 29/66* | (2006.01) |
| *H01L 21/265* | (2006.01) |
| *H01L 21/311* | (2006.01) |
| *H01L 21/31* | (2006.01) |
| *H01L 21/02* | (2006.01) |
| *H01L 21/324* | (2006.01) |

(Continued)

(52) U.S. Cl.
CPC ....... *H01L 29/7851* (2013.01); *H01L 21/0217* (2013.01); *H01L 21/02129* (2013.01); *H01L 21/02271* (2013.01); *H01L 21/2253* (2013.01); *H01L 21/26586* (2013.01); *H01L 21/31* (2013.01); *H01L 21/31111* (2013.01); *H01L 21/324* (2013.01); *H01L 21/823807* (2013.01); *H01L 21/823821* (2013.01); *H01L 27/0924* (2013.01); *H01L 29/1083* (2013.01); *H01L 29/165* (2013.01); *H01L 29/365* (2013.01); *H01L 29/66795* (2013.01); *H01L 21/823892* (2013.01)

(58) Field of Classification Search
CPC .............. H01L 29/1083; H01L 29/785; H01L 29/7851; H01L 29/66795; H01L 29/66803; H01L 21/823431
See application file for complete search history.

(56) References Cited

U.S. PATENT DOCUMENTS 6,159,823 A * 12/2000 Song ............... H01L 21/76232
257/E21.549
8,212,295 B2 7/2012 Liaw
(Continued)

OTHER PUBLICATIONS

U.S. Appl. No. 14/090,072, filed Nov. 26, 2013, by inventors Kuo-Cheng Ching, Chih-Hao Wang, Zhiqiang Wu, and Carlos H. Diaz for "Structure and Method for FinFET Device with Buried SiGe Oxide," 23 pages of text, 13 pages of drawings.

*Primary Examiner* — Tucker J Wright
(74) *Attorney, Agent, or Firm* — Haynes and Boone, LLP

(57) ABSTRACT

The present disclosure provides a semiconductor structure. The semiconductor structure includes a fin active region formed on a semiconductor substrate; a channel region of a first type conductivity, defined in the fin active region and having a first carrier concentration; and an anti-punch through (APT) feature of the first type conductivity, wherein the APT feature is formed in the semiconductor substrate, is directly underlying the channel region, and has a second carrier concentration greater than the first carrier concentration.

20 Claims, 19 Drawing Sheets

(51) Int. Cl.
*H01L 27/092* (2006.01)
*H01L 29/10* (2006.01)
*H01L 29/165* (2006.01)
*H01L 21/225* (2006.01)
*H01L 21/8238* (2006.01)

(56) References Cited

U.S. PATENT DOCUMENTS

| | | |
|---|---|---|
| 8,338,305 B2 | 12/2012 | Chen et al. |
| 8,399,931 B2 | 3/2013 | Liaw et al. |
| 2013/0280883 A1* | 10/2013 | Faul .................. H01L 29/66803 438/434 |
| 2013/0334614 A1 | 12/2013 | Liaw |
| 2014/0117462 A1* | 5/2014 | Cheng ............... H01L 29/66803 257/410 |
| 2014/0159126 A1* | 6/2014 | Wei .................... H01L 29/66795 257/288 |

* cited by examiner

INTEGRATED CIRCUIT STRUCTURE AND METHOD WITH SOLID PHASE DIFFUSION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized. Similar developments in IC processing and manufacturing are needed. For example, a three dimensional transistor, such as a fin-like field-effect transistor (FinFET), has been introduced to replace a planar transistor. Furthermore, extreme ultraviolet lithography is also introduced for forming IC patterns. Although existing FinFET devices and methods of fabricating FinFET devices have been generally adequate for their intended purposes, they have not been entirely satisfactory in all respects. For example, anti-punch-through implantation cannot be properly implemented due to the shadow effect or degradation of the mobility due to dopant residual in the channel region. Therefore, what is needed is the structure for integrated circuit structure and the method making the same to address the above issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
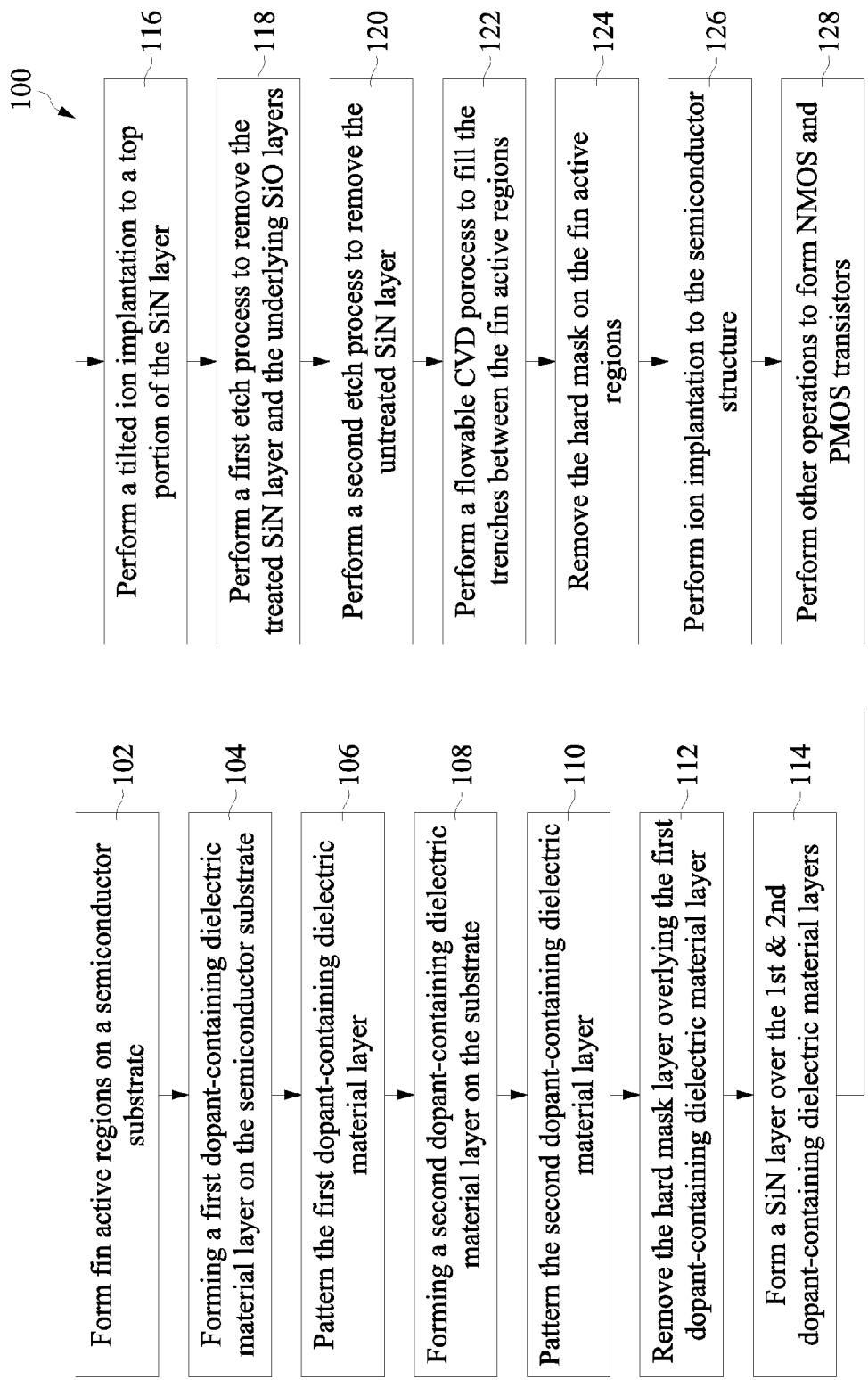
FIG. 1 is a flowchart of an integrated circuit fabrication method in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of a method 100 for fabricating a semiconductor structure (particularly including a FinFET structure having one or more FinFET devices) 200, constructed in accordance with some embodiments. FIGS. 2 through 15 are sectional views of the semiconductor structure 200 at various fabrication stages, constructed in accordance with some embodiments. It is understood that additional steps may be implemented before, during, and after the method, and some of the steps described may be replaced or eliminated for other embodiments of the method. The semiconductor structure 200 and the method 100 making the same are collectively described with reference to various figures.

Figure 2:
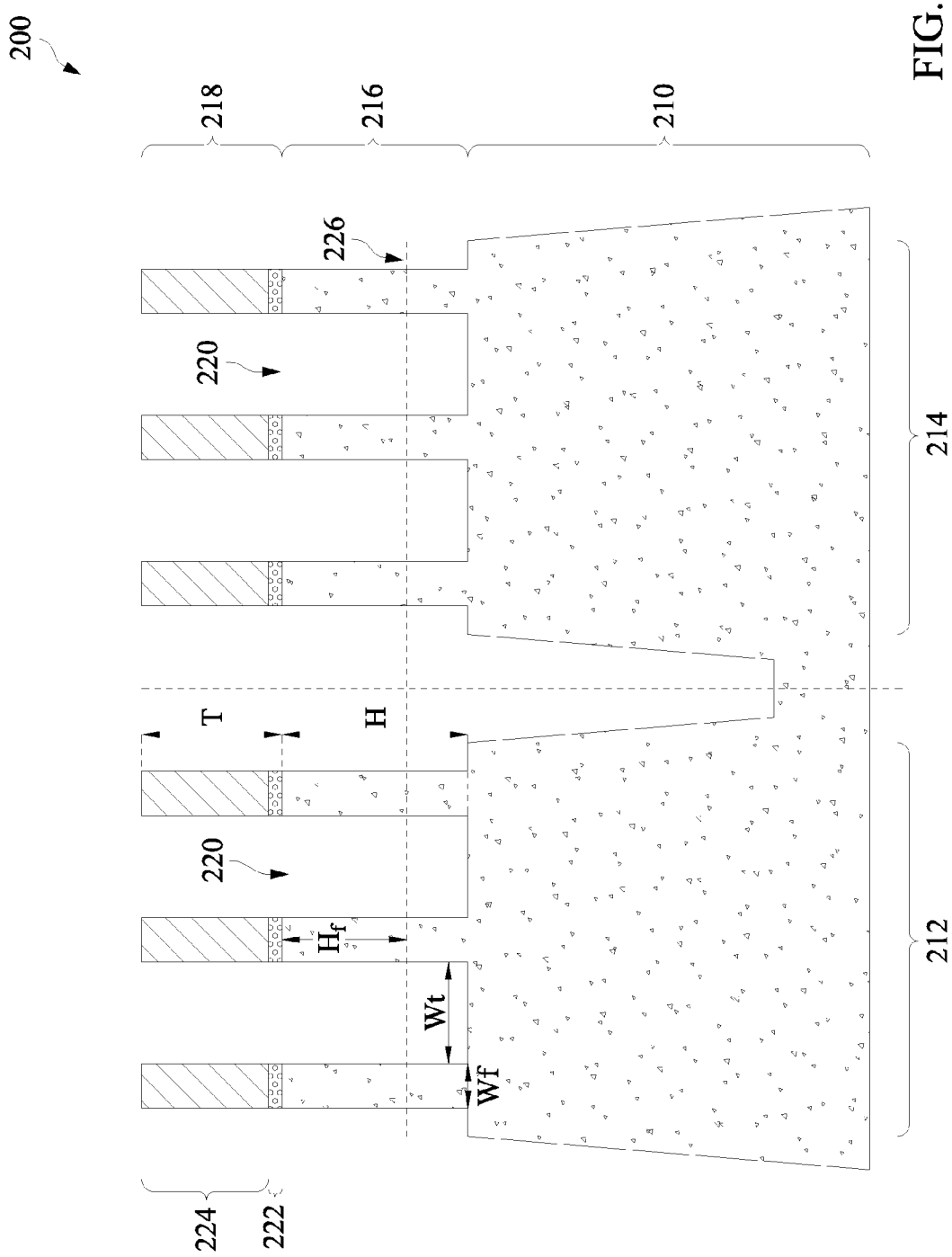
FIGS. 2 through 15 are diagrammatic sectional views of a semiconductor structure at various fabrication stages, constructed in accordance with some embodiments.

Referring to FIGS. 1 and 2, the method 100 begins at operation 102 by providing a semiconductor structure 200 having a substrate 210 and fin active regions formed thereon or forming the fin active regions on the semiconductor substrate 210. The substrate 210 includes a first region for PMOS (also referred to as a PMOS region) 212 and a second region for NMOS (also referred to as a NMOS region) 214. In the present embodiment, the substrate 210 is a bulk silicon substrate. In furtherance of the present embodiment, the substrate 210 is a silicon wafer. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof.

In another embodiment, the substrate 210 has a silicon-on-insulator (SOI) structure with an insulator layer in the substrate. An exemplary insulator layer may be a buried oxide layer (BOX). The SOI substrate may be fabricated using separation by implantation of oxygen (SIMOX), wafer bonding, and/or other suitable methods.

The substrate 210 may include various doped features depending on design requirements as known in the art. The doped features may be doped with p-type dopants, such as boron; n-type dopants, such as phosphorus or arsenic; or combinations thereof. The doped features may be formed by ion implantations.

One or more fin active regions (fins) 216 are formed on the substrate 210. The fins 216 include a semiconductor material, as active regions. In some embodiments, the fins 216 include silicon and are extended from the substrate 210 as a part of the substrate 210. In some other embodiments, the fins 216 additionally or alternatively include other semiconductor material, such as silicon germanium and/or silicon carbide, formed by a suitable technique, such as epitaxy growth.

In some embodiments, the fins 216 are formed by any suitable procedure including deposition, photolithography, and/or etching processes. In one embodiment, the fins 216 are formed by a procedure including forming a hard mask 218 and applying an etch process to the substrate 210 through the openings of the hard mask 218 to form trenches 220 in the substrate 210, thereby forming the fin active regions 216.

The hard mask 218 may be formed by a procedure that includes depositing a hard mask material layer. In some embodiments, the hard mask material layer includes a silicon oxide 222 and a silicon nitride 224 subsequently deposited on the substrate 210. The procedure to form the hard mask 218 further includes forming a patterned photoresist (resist) layer by a lithography process, and etching the hard mask material layer through the openings of the patterned resist layer to form the hard mask layer 218 having openings.

An exemplary photolithography process may include forming a resist layer, exposing the resist by a lithography exposure process, performing a post-exposure bake process, and developing the photoresist layer to form the patterned photoresist layer. The lithography process may be alternatively replaced by other technique, such as e-beam writing, ion-beam writing, maskless patterning or molecular printing.

In some other embodiments, the patterned resist layer may be directly used as an etch mask for the etch process to form the trenches 220. In some other embodiments, the hard mask 218 includes silicon oxide, silicon nitride, silicon oxynitride, silicon carbide, any other suitable dielectric material, or a combination thereof. The hard mask 218 may include a single material layer or multiple material films. The hard mask layer 212 may be formed by thermal oxidation, chemical vapor deposition (CVD), atomic layer deposition (ALD), or any other appropriate method.

The method 100 employs a procedure to form anti-punch-through (APT) doping profile through with enhanced device performance. The procedure is referred to as a precise material modification (PMM). The PMM is utilized through controlling various dimensions of the semiconductor structure 200. For example, the trenches 220 each includes a width Wt and the fins 216 each includes a width Wf. The fins 216 include a height H. The hard mask 218 includes a thickness T. As an example for illustration, Wt is about 22 nm, Wf ranges from about 6 nm to about 10 nm, the fin height H is about 50 nm, and the hard mask thickness T is about 28 nm (such as about 4 nm thick silicon oxide and about 24 nm thick silicon nitride). Desired final fin height $H_f$ ranges from about 33 nm to about 40 nm. The desired final fins are expected to span vertically from the reference level 226 to the top of the fins 216.

In some embodiments, the trenches 220 may have a different structure formed by a different procedure. For example, the trenches 220 include a deeper trench between the PMOS region 212 and the NMOS region 214, and further include shallower trenches within each of the NMOS and PMOS regions.

Figure 3:
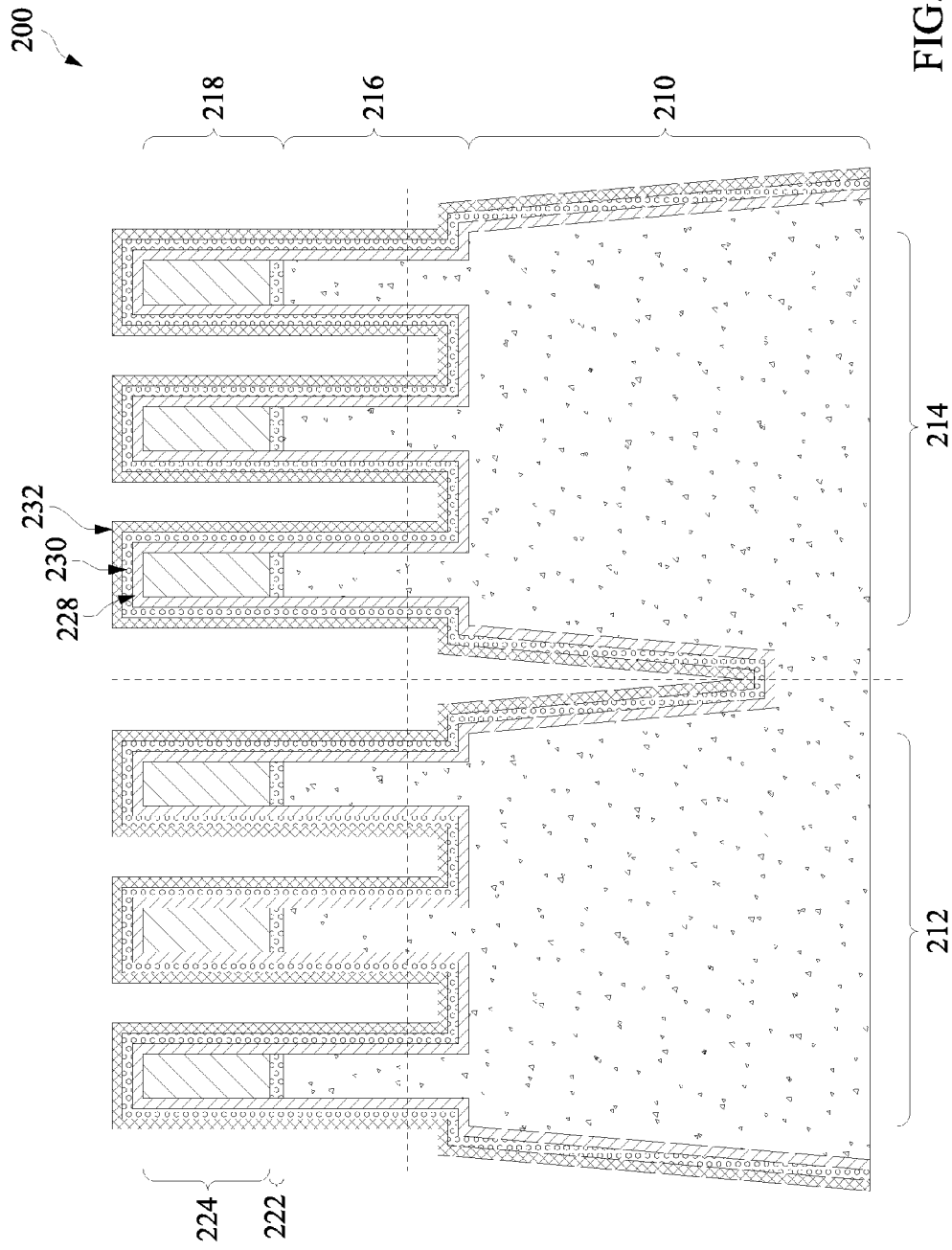

Referring to FIGS. 1 and 3, the method 100 proceeds to operation 104 by forming a first dopant-containing dielectric material layer having a first-type dopant. In the present embodiment, the first type dopant is an n-type dopant. In some embodiments, the operation 104 includes depositing a phosphosilicate glass (PSG) layer 228 containing n-type dopant. The PSG layer 228 functions as a solid source for the n-type dopant to be introduced to the substrate 210. The concentration of the n-type dopant in the PSG layer 228 is designed such that to introduce the n-type dopant with a proper doping concentration during one or more subsequent thermal process. In some embodiments, the dopant concentration of the PSG layer 228 ranges from about $10^{21}/cm^3$ to about $8\times10^{21}/cm^3$. The PSG layer 228 is formed by a suitable technique, such as CVD with suitable precursor. In some examples, the precursor to form the PSG layer 228 by CVD includes $SiH_4$, $O_2$, and $PH_3$.

In some embodiments, the operation 104 further includes depositing un-doped silicate glass (USG) layer 230 on the PSG layer 228 and depositing a silicon nitride layer 232 on the USG layer 230. The USG layer 230 is a capping layer to protect the PSG layer 228. For example, PSG is unstable and may react with water. The USG layer 230 is able to protect the PSG from moisture. The silicon nitride layer 232 functions as a hard mask layer. Various material layers may be formed by suitable technology, such as CVD. The thicknesses of the deposited material layers are tuned according to the considerations of the PMM procedure. In some embodiments, the PSG layer 228 and the USG layer 230 have thicknesses of about 1 nm and about 1 nm, respectively.

Figure 4:
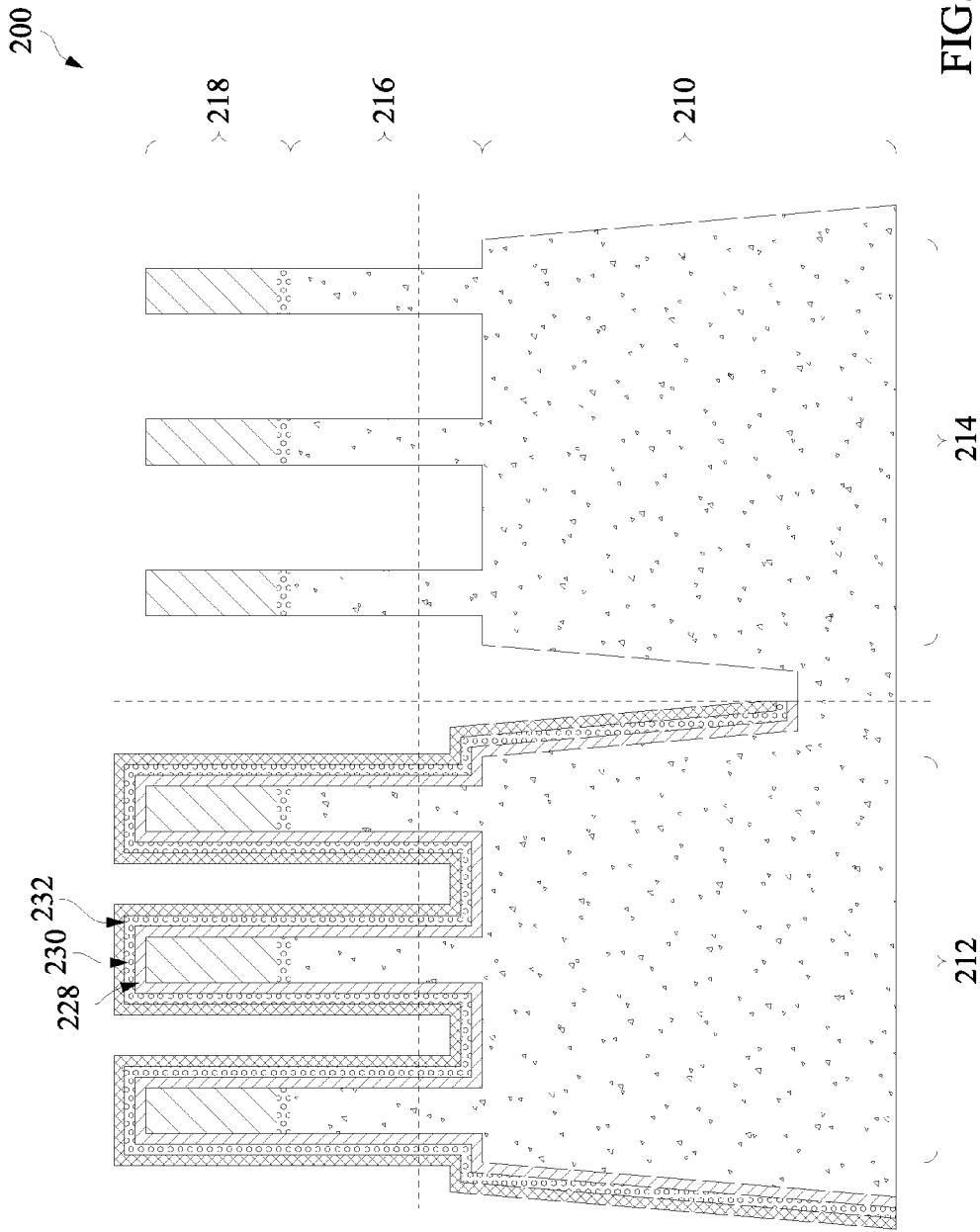

Referring to FIGS. 1 and 4, the method 100 proceeds to operation 106 by patterning the first dopant-containing dielectric material layer such that the portion within the NMOS region 214 is removed. In the present embodiments, the silicon nitride layer 232, the USG layer 230 and the PSG layer 228 within the NMOS region 214 are removed so that the fins 216 within the NMOS region 214 are uncovered thereby. In some embodiments, the operation 106 includes forming a patterned resist layer by a lithography process, and etching the material layers (including the silicon nitride layer 232, the USG layer 230 and the PSG layer 228) through the openings of the patterned resist layer. In some embodiments, the etch process may include multiple etch steps with respective etchant to different material layers. For example, the PSG layer 282 and the USG layer 230 are etched by an etchant including hydrofluoric acid, and the silicon nitride layer 232 is etched by an etchant including phosphorous acid. In other embodiments, a hard mask may be additionally used to pattern the first dopant-containing dielectric material layer by a procedure that includes forming a patterned hard mask, etching the material layers (including the silicon nitride layer 232, the USG layer 230 and the PSG layer 228) through the openings of the patterned hard mask, and removing the patterned hard mask. The formation of the patterned hard mask is similar to the method of forming the hard mask 218 in the operation 102.

Figure 5:
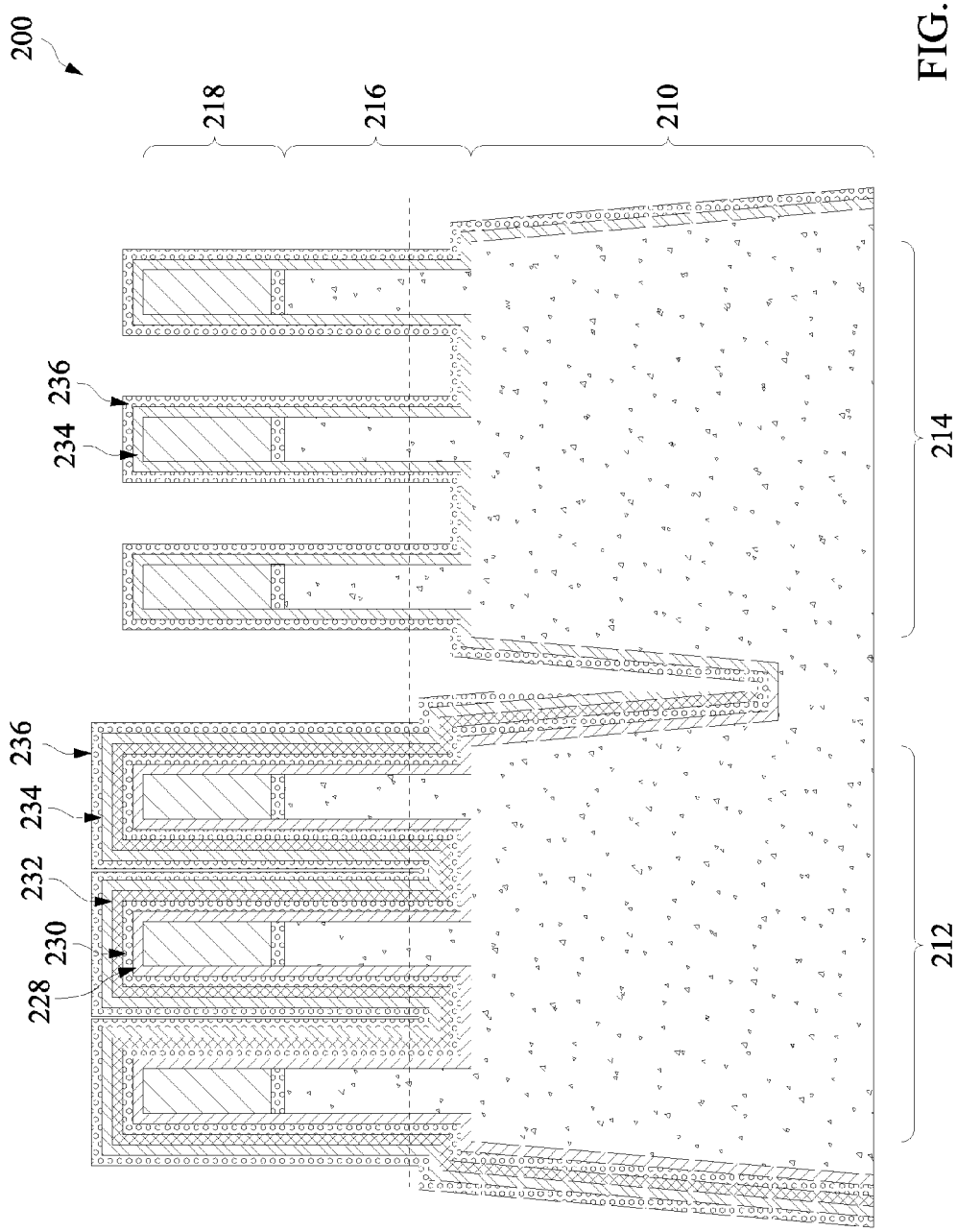

Referring to FIGS. 1 and 5, the method 100 proceeds to operation 108 by forming a second dopant-containing dielectric material layer having a second-type dopant opposite to the first-type dopant. In the present embodiment, the second type dopant is a p-type dopant. In some embodiments, the operation 108 includes depositing a borosilicate glass (BSG) layer 234 containing p-type dopant.

The PSG layer 234 functions as a solid source for the p-type dopant to be introduced to the substrate 210. The concentration of the p-type dopant in the BSG layer 234 is designed such that to introduce the p-type dopant with a proper doping concentration during one or more subsequent thermal process. In some embodiments, the dopant concentration of the BSG layer 234 ranges from about $10^{21}/cm^3$ to about $8\times10^{21}/cm^3$. The BSG layer 234 is formed by a suitable technique, such as CVD with suitable precursor. In some examples, the precursor to form the BSG layer 234 by CVD includes $SiH_4$, $O_2$, and $B_2H_6$.

In some embodiments, the operation 108 further includes depositing an USG layer 236 on the BSG layer 234. The USG layer 236 is a capping layer to protect the BSG layer 234. Various material layers may be formed by suitable technology, such as CVD. The thicknesses of the deposited material layers are tuned according to the considerations of the PPM procedure. In some embodiments, the BSG layer 234 and the USG layer 236 have thicknesses of about 1 nm and about 2 nm, respectively.

Figure 6:
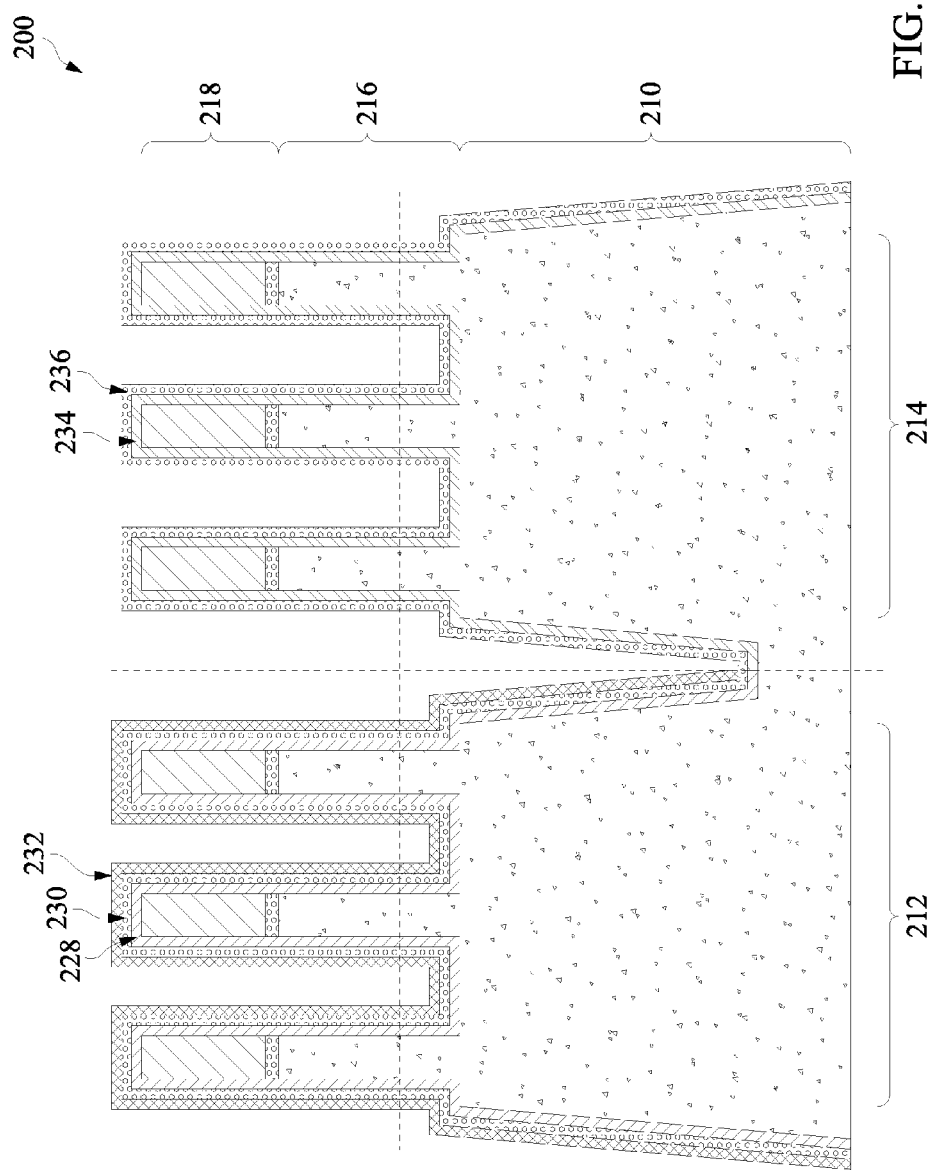

Referring to FIGS. 1 and 6, the method 100 proceeds to operation 110 by patterning the second dopant-containing dielectric material layer such that the portion within the PMOS region 212 is removed. In the present embodiments, the USG layer 236 and the BSG layer 234 within the PMOS region 212 are removed so that the underlying silicon nitride layer 232 within the PMOS region 212 are uncovered thereby. In some embodiments, the operation 110 includes forming a patterned resist layer by a lithography process, and etching the material layers (including the USG layer 236 and the BSG layer 234) through the openings of the patterned resist layer. For example, the BSG layer 234 and the USG layer 236 are etched by an etchant including hydrofluoric acid. In other embodiments, a hard mask may be additionally used to pattern the second dopant-containing dielectric material layer by a procedure that includes forming a patterned hard mask, etching the material layers (including the USG layer 236 and the BSG layer 234) through the openings of the patterned hard mask, and removing the patterned hard mask. The formation of the patterned hard mask is similar to the method of forming the hard mask 218 in the operation 102.

Figure 7:
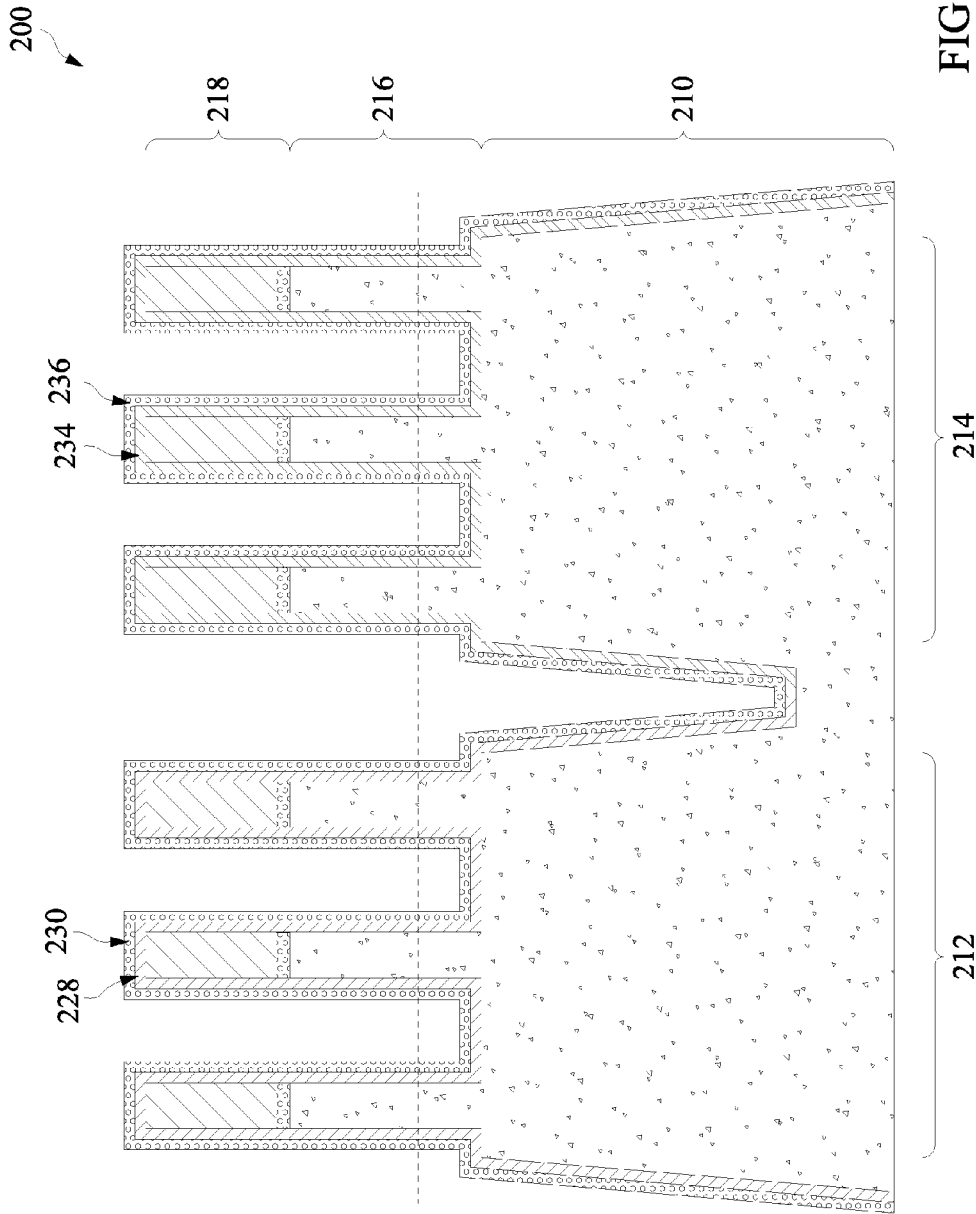

Referring to FIGS. 1 and 7, the method 100 may include an operation 112 by removing the hard mask layer 232 overlying the first dopant-containing dielectric material layer (the PSG layer 228 in the present embodiment). In some embodiments, the hard mask layer 232 functions as an etch stop layer during the patterning of the second dopant-containing dielectric material layer so that the corresponding etching process stops on the silicon nitride layer 232, which is removed by the operation 112 for the consideration of the PMM procedure. In some embodiment, the silicon nitride layer 232 is removed by an etch process with an etchant having phosphorous acid.

Figure 8:
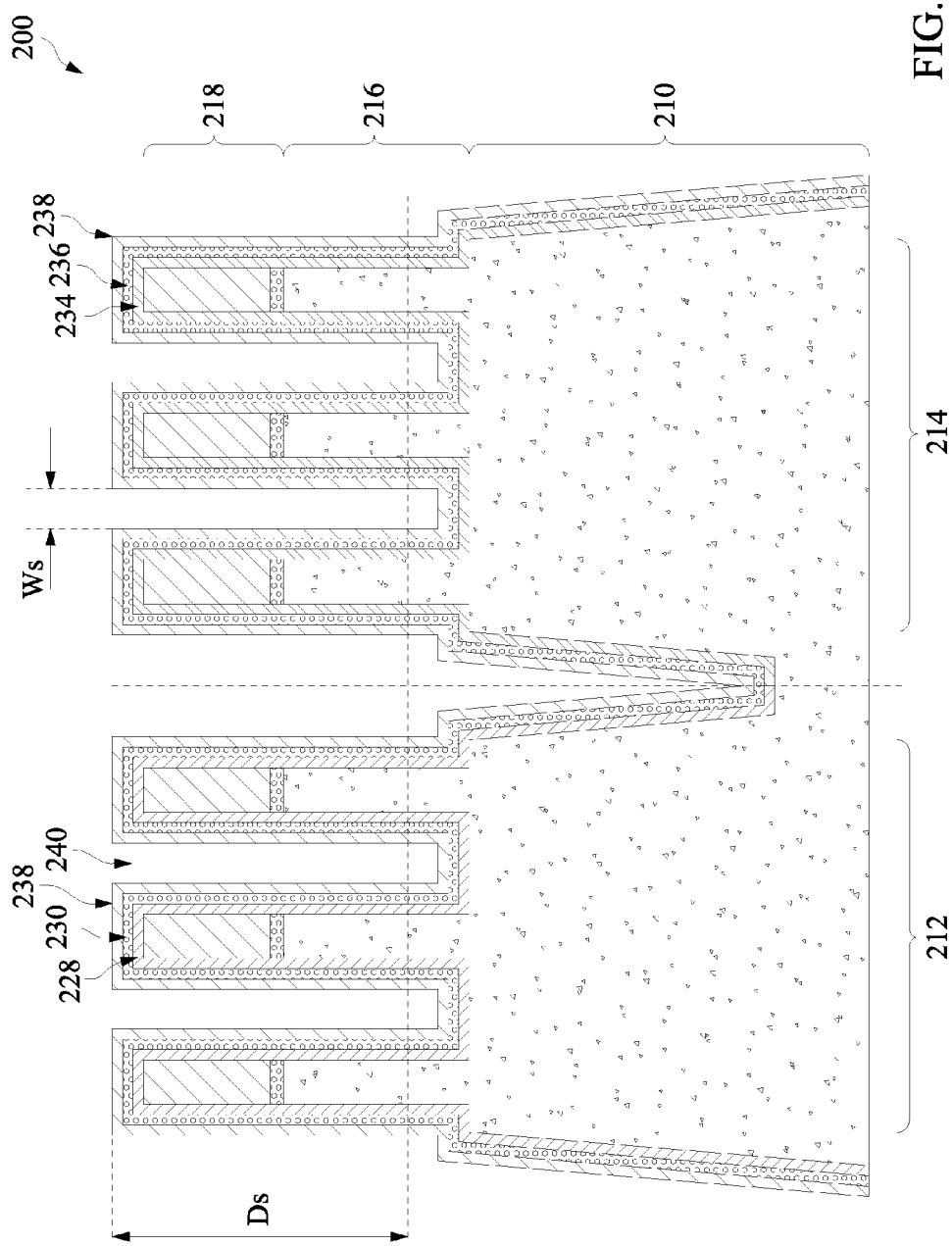

Referring to FIGS. 1 and 8, the method 100 may include an operation 114 by forming a silicon nitride (SiN) layer 238 over the first dopant-containing dielectric material layer in the PMOS region 212 and the second dopant-containing dielectric material layer in the NMOS region 214. The silicon nitride layer 238 is formed by a suitable technique, such as CVD. The thickness of the SIN layer 238 is controlled and tuned according to the processing consideration, such as the consideration of the PMM procedure. After the deposition of the silicon nitride layer 238, trenches 240 defined between the fins (and the hard mask 218) have a trench width Ws and a trench depth Ds that vertically spans from the top to the reference line 226.

Figure 9:
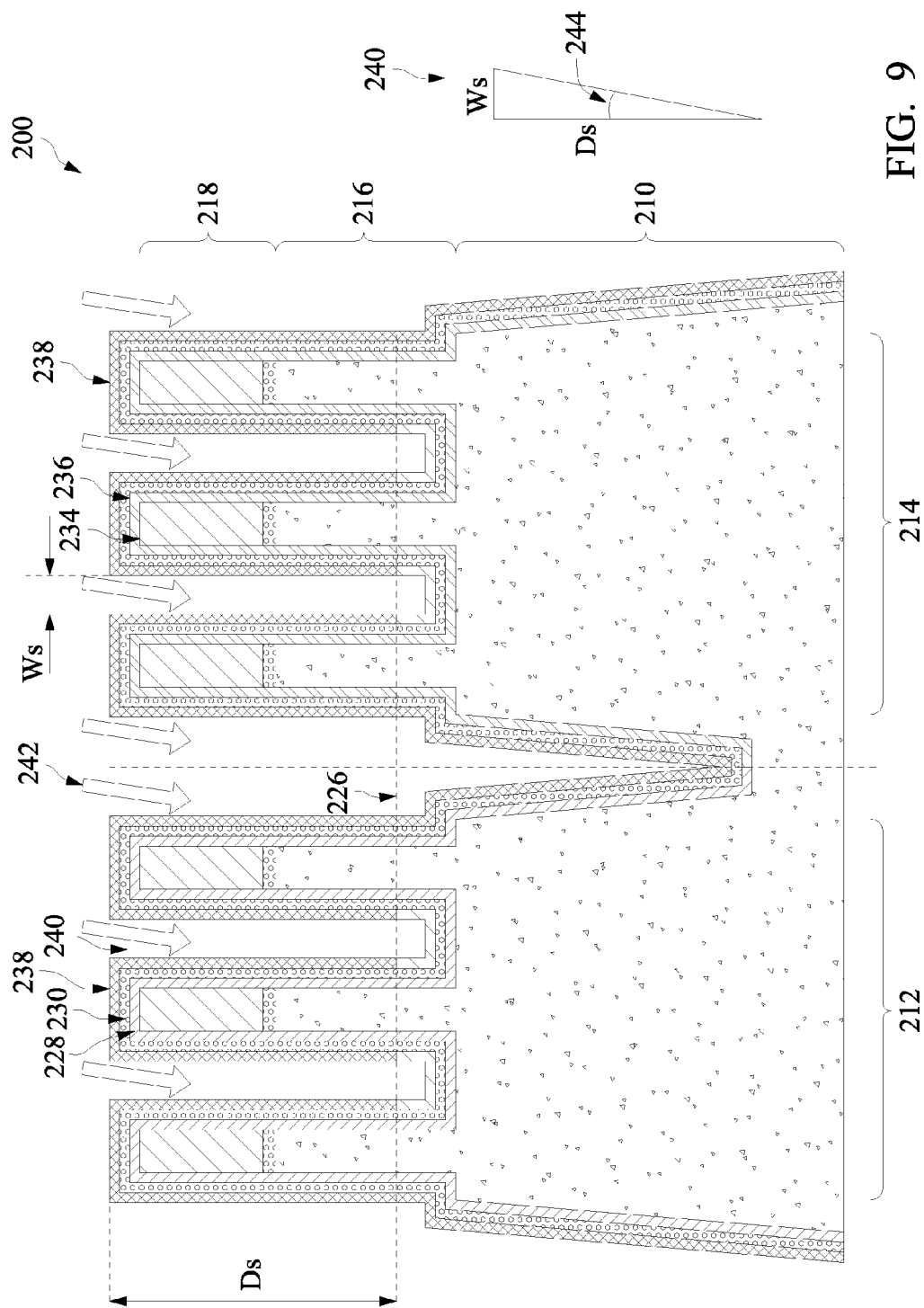

Referring to FIGS. 1 and 9, the method 100 may include an operation 116 that modifies the etching characteristic of top portion of the silicon nitride layer 238, thereby controlling the final fin height and the anti-punch-through doping profile in the present embodiment. In the present embodiment, the operation 116 includes an ion implantation process 242.

The ion implantation process 242 is applied to the silicon nitride layer 238. In some embodiments, the ion implantation process 242 includes an ion implantation with oxygen species to introduce the oxygen into the SiN layer, thereby oxidizing the SiN layer 238 in portions. The portions of the SiN layer 238 being oxidized and the portions of the SIN layer 238 not being oxidized have different etch characteristics during the subsequent etching process and thus will be patterned by the subsequent etching process.

In the present embodiment, the ion implantation process 242 is a tilted ion implantation applied to the SiN layer 238 with a tilt angle. The tilt angle of the ion implantation process 242 is designed such that the implanted portions of the SiN layer 238 are the portions vertically spanning from the top surface down to the reference line 226, which defines the desired fins. Particularly, this is achieved by the precise material modification procedure with consideration of various dimensions and the tilt angle of the ion implantation process 242. The trenches 240 are further illustrated in right side of FIG. 9 with the corresponding dimensions Ws and Ds. The depth Ds is measured from the top surface to the reference line 226. The tilt angle φ 244 of the ion implantation process 242 is also illustrated. In the present embodiment, the tilt angle φ is related to Ds and Ws by a formula having tan(φ) and Ws/Ds ratio. Particularly, tan(φ)=Ws/Ds in the present example. Ds and Ws are further determined by various parameters including Wf, Wt, Hf and the thicknesses of various material layers. In a particular example for illustration, Ws is about 12 nm and Ds is about 66 nm, and then the tilt angle φ is about 10.3 degree.

Furthermore, the ion implantation process 242 includes two steps: the first step (shown in FIG. 9) is an ion implantation with the tilt angle such that the ion beam is toward the left sidewalls and the second step (not shown) is another ion implantation with the tilt angle such that the ion beam is toward the right sidewalls of the SiN layer 238.

The tilt ion implantation process 242 turns top portions of the SiN layer 238 into silicon oxynitride such that the etch selectivity between the underlying silicon oxide (USG and PSG layers in the PMOS region 212 and USG and BSG in the NMOS region 214) and the implanted portions of the SiN layer 238 is substantially reduced during the subsequent etching process.

Figure 10:
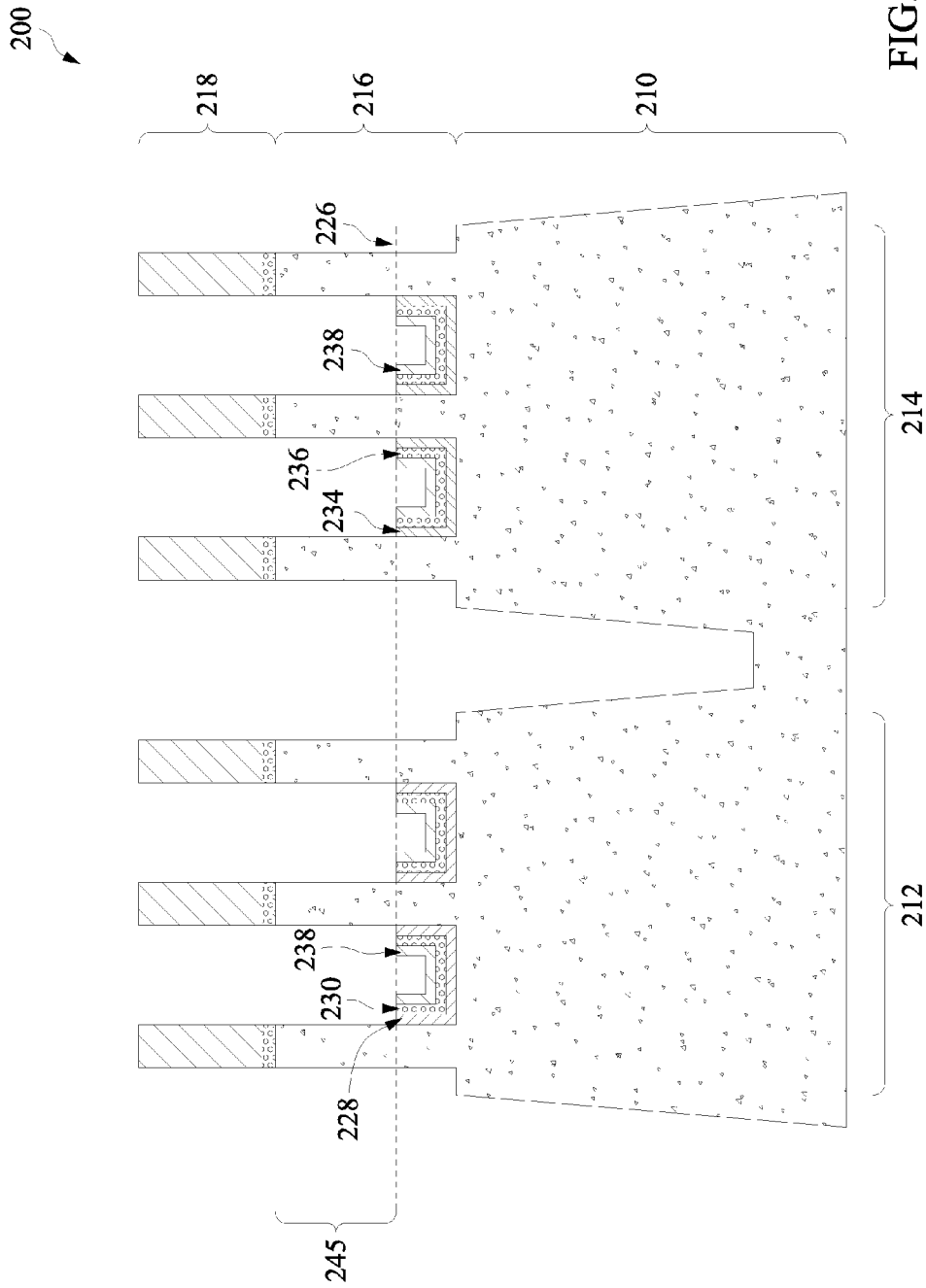

Referring to FIGS. 1 and 10, the method 100 includes an operation 118 by performing a first etching process to the semiconductor structure so that the treated (implanted) SiN layer 238, the top portions of USG layers 236 and 230, PSG layer 228 and BSG layer 234 are removed. The untreated (not-implanted) SiN layer 238 and the bottom portions of USG layers 236 and 230, PSG layer 228 and BSG layer 234 remain after the completion of the etching process. In some embodiments, the first etching process includes a wet etching process with an etchant having hydrofluoric acid (HF), such as diluted HF solution, to selectively remove the treated SiN layer 238 and the underlying silicon oxide layers.

At the present, the fin active regions 216 are modified to have a different height. The bottom surface of the modified fin active regions is at the reference line 226. The modified fin active regions are now labeled by numeral 245. Channel regions in FETs are defined in the modified fin active regions 245.

The above procedure that precisely modifies and patterns the SiN layer 238 is referred to as precise material modification (PMM). The PMM includes deposition of the SiN layer and performing a tilted ion implantation to oxidize the top portion of the SiN layer.

Figure 11:
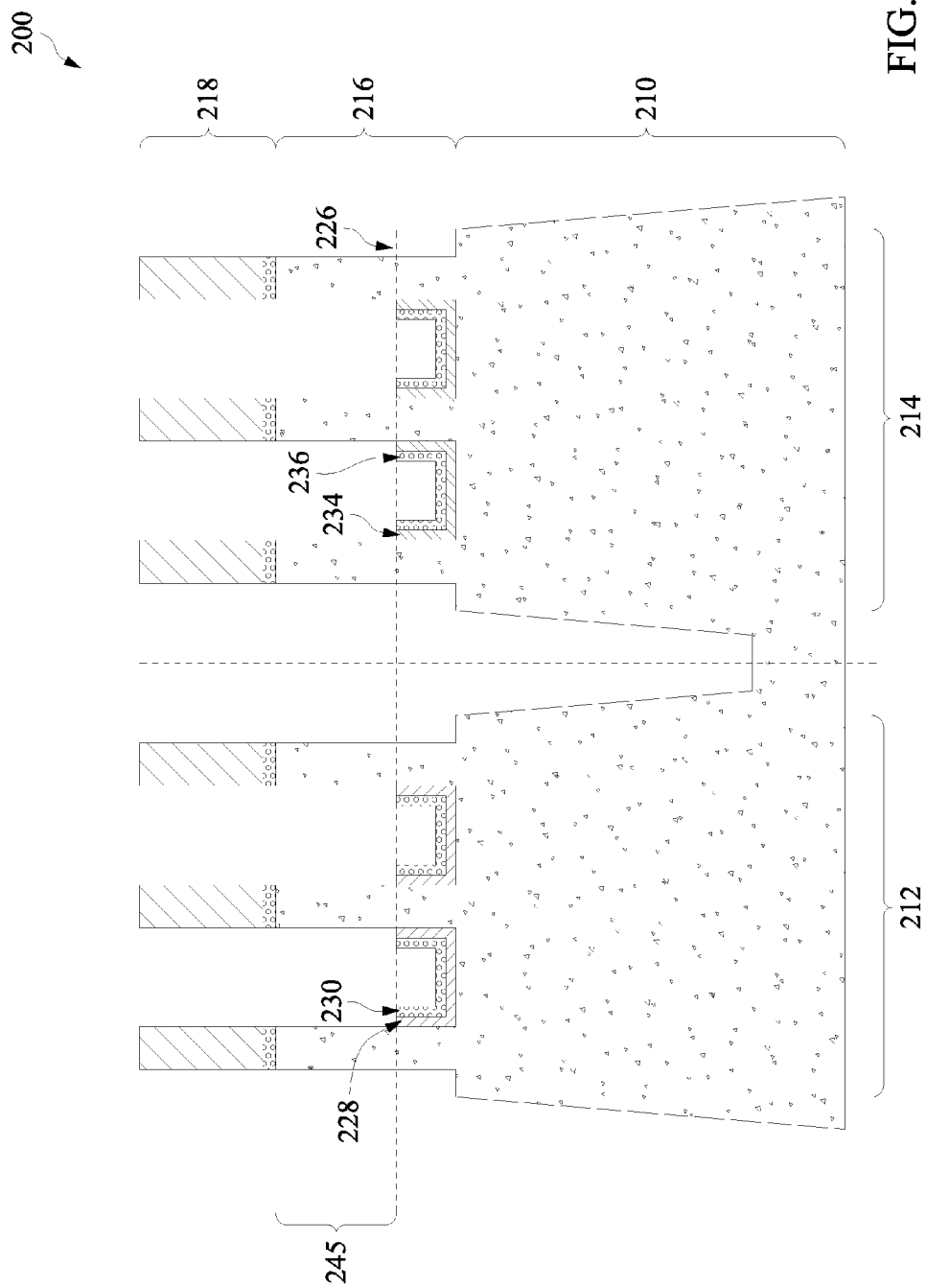

Referring to FIGS. 1 and 11, the method 100 may include an operation 120 by performing a second etching process to selectively remove the untreated portion of the SiN layer 238. In some embodiments, the second etching process includes a wet etching process with an etchant having phosphorous acid to selectively remove the untreated SiN layer 238.

At this stage, the remaining dopant-containing dielectric material layers, such as PSG layer 228 and BSG layer 234 serve as solid diffusion sources. In the present embodiment, the remaining PSG layer 228 and BSG layer 234 are U-shaped as illustrated in FIG. 11.

Figure 12:
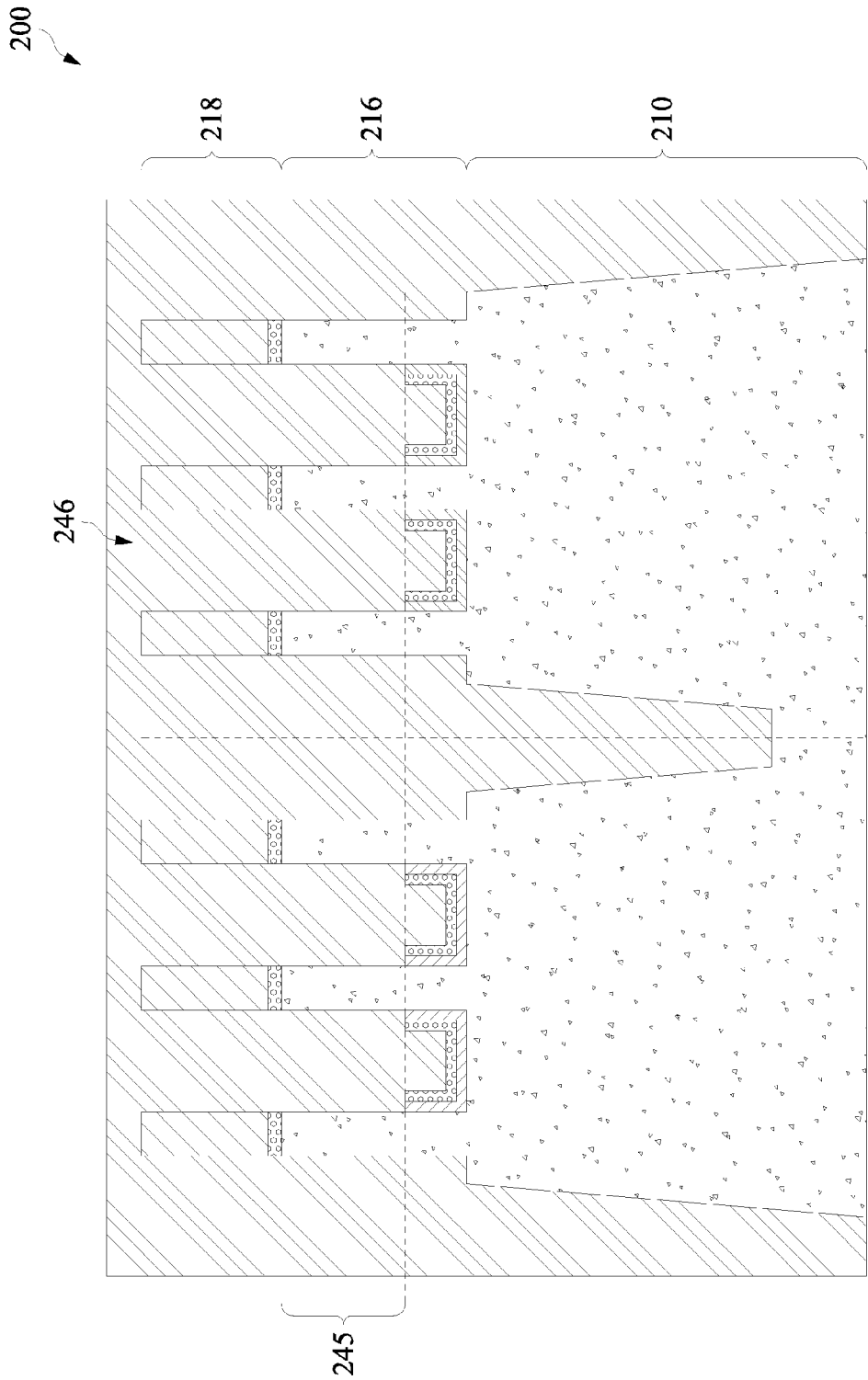

Referring to FIGS. 1 and 12, the method 100 may include an operation 122 by filling the trenches between the fins 216 with a dielectric material 246. In some embodiments, the dielectric material 246 includes silicon oxide. In some embodiments, the dielectric material 246 is formed by a flowable CVD (FCVD) process. The FCVD process includes depositing a flowable material (such as a liquid compound) on the substrate to fill the trenches and converting the flowable material to a solid material by a suitable technique, such as annealing in one example.

In some embodiments, the deposition of the flowable material to the substrate 210 includes introducing silicon-containing compound and oxygen-containing compound. The silicon-containing compound and oxygen-containing compound react to form a flowable dielectric material, thereby filling the trenches between the fins 216. In some embodiments, the process to convert the flowable material into a solid material includes an annealing process. In some examples, the annealing process has an annealing temperature ranging from about 300° C. to about 1200° C. and an annealing duration ranging from about 5 seconds to about several hours. In some other embodiments, the process to convert the flowable material includes a plasma treatment to the flowable material to achieve the conversion.

Figure 13:
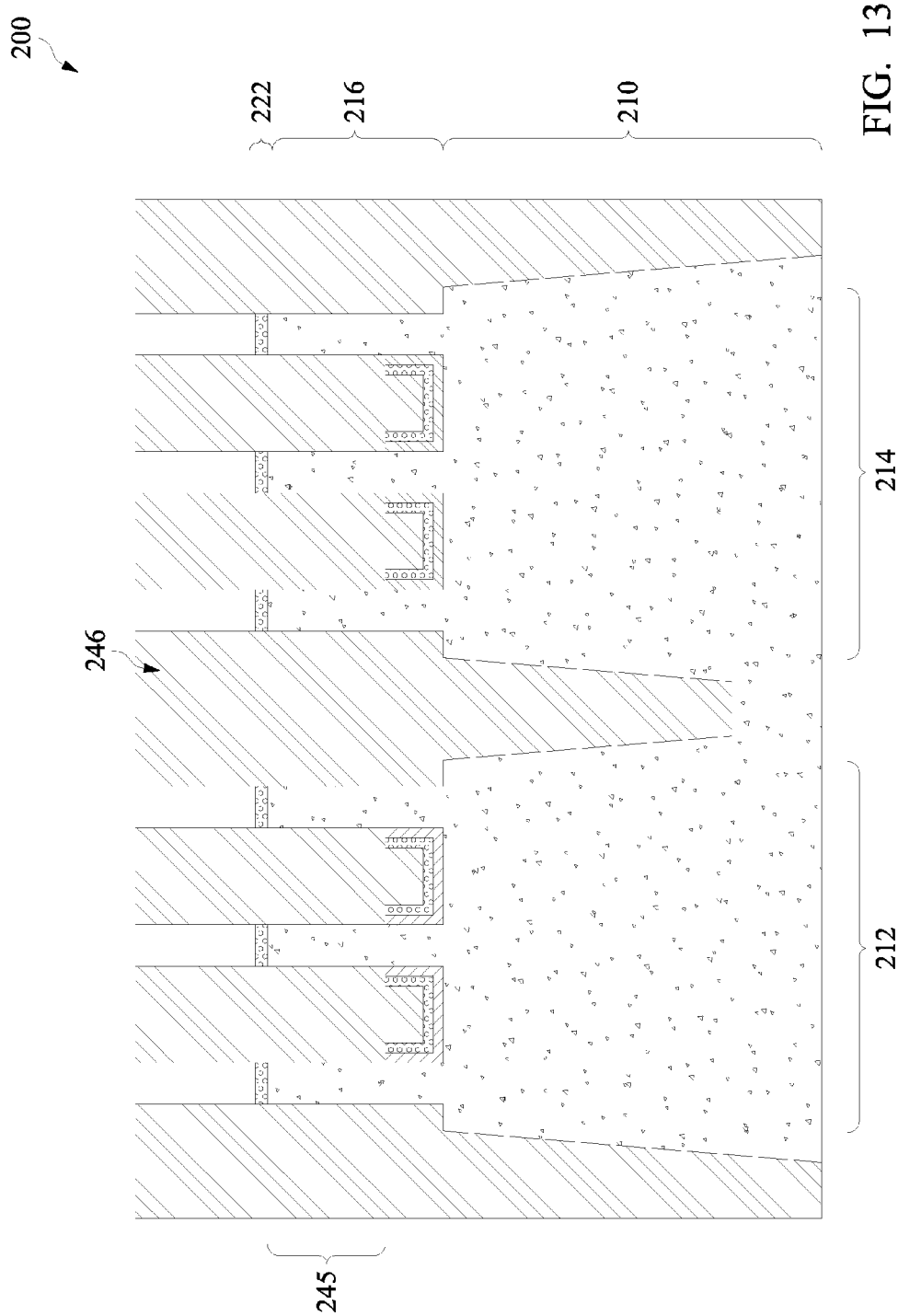

Referring to FIGS. 1 and 13, the method 100 may include an operation 124 by removing at least portion of the hard mask 218 overlying the fin active regions 216. In some embodiments, the silicon nitride layer 224 of the hard mask 218 is removed by the operation 124. The operation 124 includes an etch process designed to selectively remove the silicon nitride layer 224 relative to silicon oxide, such as silicon oxide layer 222 and the dielectric material 246 (silicon oxide in the present embodiment). In some examples, the etchant used to remove the silicon nitride layer 224 includes phosphorous acid. In some other embodiment, the operation 124 may further include another step to recess the dielectric material 246 such that the silicon nitride layer 224 is uncovered by the dielectric material 246, prior to the etch process to remove the silicon nitride layer 224. For examples, the dielectric material 246 may be recessed by a polishing process, such as chemical mechanical polishing (CMP) or an etch-back process. As an example, the silicon oxide layer 222 may serve as an implantation screen mask layer during the subsequent ion implantation.

The method 100 may include other alternatives or modifications. In some embodiments, the operations 104-112 to form the first (n-type) and second (p-type) dopant-containing dielectric material layers may have different sequences such that the second dopant-containing dielectric material layer is formed before the formation of the first dopant-containing dielectric material layer. Particularly, the p-type dopant-containing dielectric material layer is formed on the substrate 210. The p-type dopant-containing dielectric material layer includes a BSG layer, a USG layer over the BSG layer, and a SiN layer over the BSG layer. The p-type dopant-containing dielectric material layer is then patterned such that the portions within the PMOS region 212 are removed by a procedure that includes a lithography process and etching. An n-type dopant-containing dielectric material layer is formed on the substrate 210. The n-type dopant-containing dielectric material layer includes a PSG layer and another USG layer over the PSG layer. The n-type dopant-containing dielectric material layer is then patterned such that the portions within the NMOS region 214 are removed by a procedure that includes a lithography process and etching. In other embodiments, the SiN layer 232 may be replaced by a suitable material layer, such as silicon carbide, to function as a hard mask during the patterning of the corresponding first dopant-containing dielectric material layer.

Figure 14:
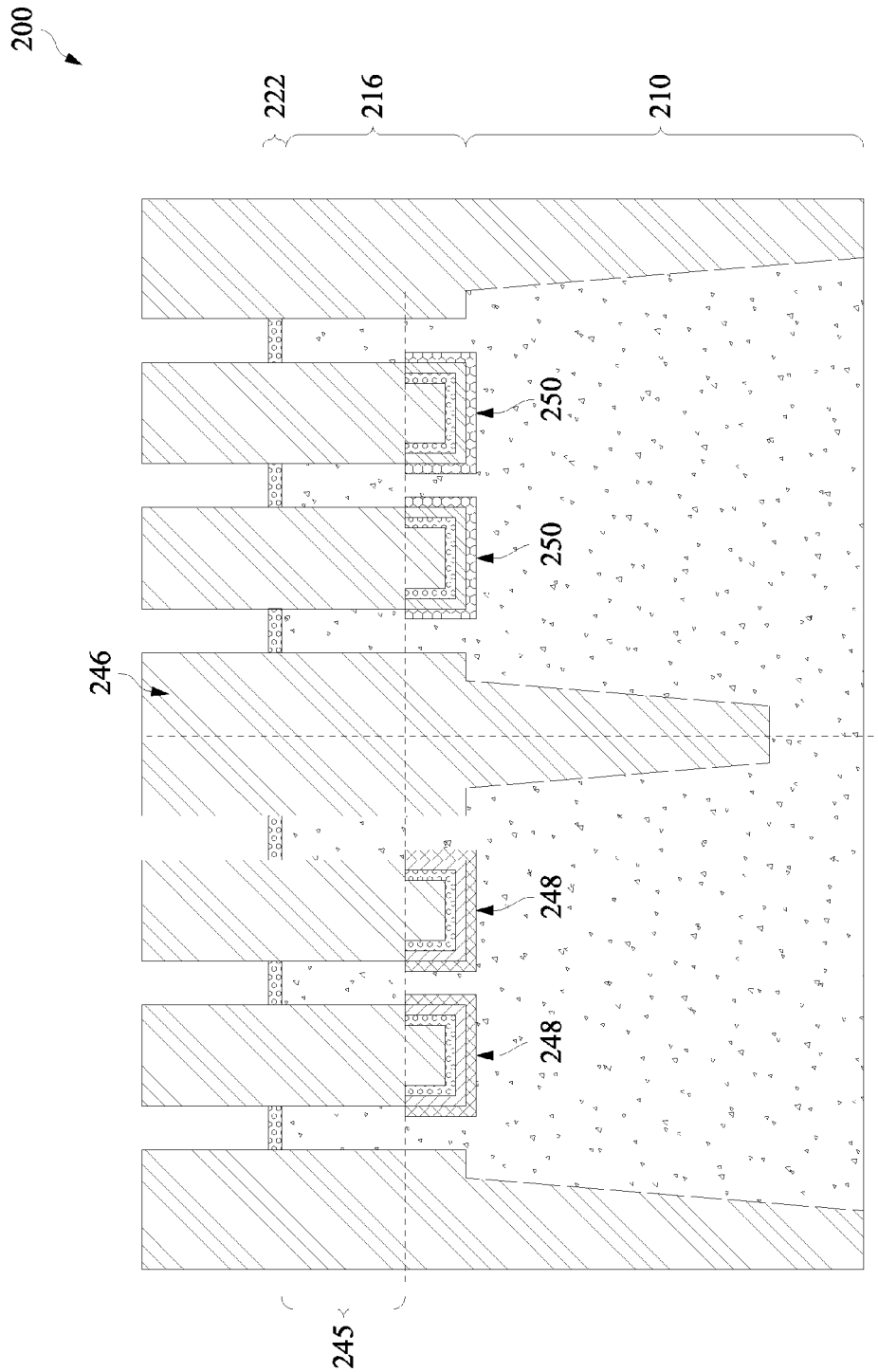
Figure 15:
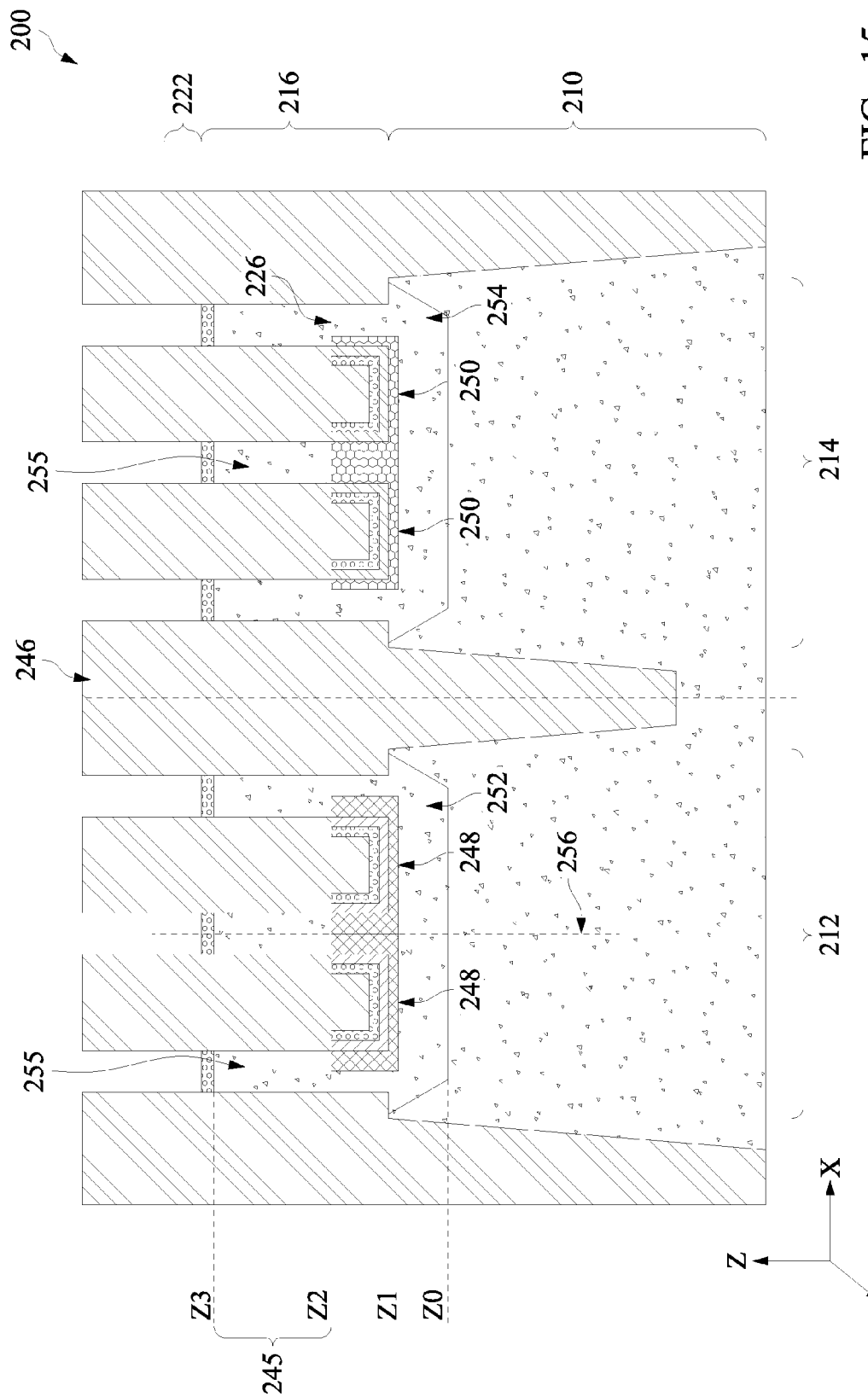

The method 100 further includes other operations before, during and/or after the operations described above. In some embodiments, one or more thermal annealing process is applied to the semiconductor structure 200, after the formation of the first and second dopant-containing dielectric material layers, so that the patterned dopant-containing dielectric material layers as solid phase dopant sources to diffuse respective type dopants to respective regions (e.g., the n-type dopant to the PMOS region 212 and the p-type dopant to the NMOS region 214). In other embodiments, the thermal annealing to diffuse the dopants from the solid phase dopant sources may be achieved by other subsequent annealing steps (such as thermal annealing to active implanted species to form source and drain features) with consideration and design of the thermal budget. Thereby, the corresponding doping features are formed in the substrate 210 and are surrounding the respective patterned dopant-containing dielectric material layers, as illustrated in FIG. 14 in a sectional view. In the present embodiments, those doping features include n-type doping features (n-type anti-punch-through features or n-type APT features) 248 in the PMOS region 212 and p-type doping features (p-type APT features) 250 in the NMOS region 214. In some embodiments, the n-type APT features 248 (or the p-type APT features 250) are extended horizontally such that the n-type APT features 248 (or the p-type APT features 250) from both sides of a same fin active region are merged together, as illustrated in FIG. 15 in a sectional view. Those doping features are capable of preventing the transistors from punch-through effect and also eliminating undesired impact of the dopants to the channels, thus the device performance being enhanced.

Referring to FIGS. 1 and 15, the method 100 further includes an operation 126 having one or more ion implantations to form or tune respective doping features of various devices, such as PMOS transistor(s) in the PMOS region 212 and NMOS transistor(s) in the NMOS region 214. Taking the PMOS region 212 as an example, the operation 126 may include an ion implantation to for an n-type doped well (N-well) 252 in the PMOS region 212. The N-well 252 vertically spans in the Z direction from Z0 to Z1. The doping type of the N-well 252 is same to the doping type of the APT feature 248 but the doping concentration of the N-well 252 is less than the doping concentration of the APT feature 248. Similarly, the operation 126 may include another ion implantation to form a p-type doped well (p-well) 254 in the NMOS region 214. The P-well 254 vertically spans in the Z direction from Z0 to Z1. The doping type of the P-well 254 is same to the doping type of the APT feature 250 but the doping concentration of the P-well 254 is less than the doping concentration of the APT feature 250. In some embodiments, the N-well 252 includes an n-type dopant, such as phosphorous; and the P-well 254 includes a p-type dopant, such as boron.

Still taking the PMOS region 212 as an example, the operation 126 may include one or more ion implantations to the respective channel region 255 so that the channel performance is improved. For example, the threshold voltage of the corresponding transistors is tuned. The channel region 255 is defined in the fin active region and vertically spans in the fin active region from Z2 to Z3. A dopant is introduced into the fin active regions to tune the carrier concentration in the channel regions of the corresponding transistors. In some situations, the carrier concentration could be different from the doping concentration since a doped feature may include two type dopants (p-type and n-type dopant). The carrier concentration is determined by the difference between the p-type dopant concentration and the n-type dopant concentration. In the operation 126, the type of dopant introduced to the channel region depends on individual tuning of the carrier concentration. For example, the carrier concentration is tuned down when an opposite type of dopant is introduced to a previously doped region, such as introducing p-type dopant to the n-type channel regions in the PMOS region 212. For another example, the carrier concentration is tuned up when a same type of dopant (n-type dopant in the PMOS region 212) is introduced. To avoid confusion, the n-type channel region and p-type channel region may also be referred to as channel regions with opposite type conductivities (or n-type conductivity and p-type conductivity) in the following descriptions. Other n-type and p-type features may be referred to in a similar way. For example, the APT feature and the channel region have same type conductivity.

The carrier concentration of the channel region is less than the carrier concentration of the corresponding doped well and is much less than the carrier concentration of the corresponding APT feature. But the conductivity type of the channel region is the same to the conductivity type of the corresponding doped well and APT feature. For example, the conductivity type in the channel region of a PMOS transistor within the PMOS region 212 is n-type, same to the conductivity type of the n-type ATP feature 248 within the PMOS region 212. Similarly, the conductivity type in the channel region of a NMOS transistor within the NMOS region 214 is p-type, same to the conductivity type of the p-type ATP feature 250 in the NMOS region 214.

This is further described by taking the PMOS region 212 as an example (the NMOS region 214 is similar but opposite type). Along the vertical direction (Z direction) 252, Z1 represent the bottom surface of the corresponding APT feature 248, Z2 is at an interface 226 and Z3 is the top surface of the fin active region 216. The modified fin active regions 245 vertically span from Z2 to Z3, which is different from the fin active regions at the earlier stage as illustrated in FIG. 2. The APT features 248 spans vertically from Z1 to Z2.

Figure 16:
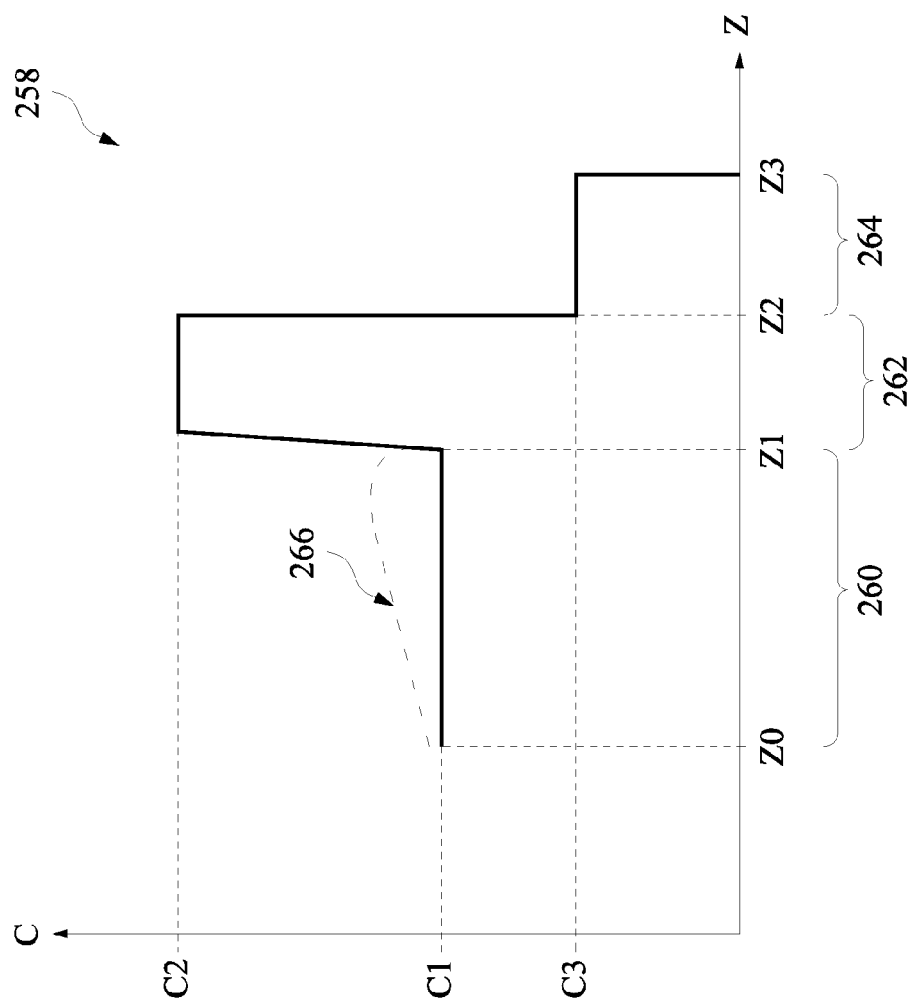
FIG. 16 is a diagrammatic view of a doping profile in the semiconductor structure of FIG. 15, constructed in accordance with some embodiments.

Accordingly, along the vertical direction 256 from Z0 to Z3, a doping profile 258 is illustrated in FIG. 16. The doping profile 258 includes three portions with respective doping concentrations that are independently tunable by the method 100. In FIG. 16, the horizontal axis "Z" represents a distance in the Z direction along the vertical line 256 and the vertical axis "C" represents doping concentration in a proper unit, such as $cm^{-3}$ in the present example. Along the vertical direction 256, the doping concentrations profile 258 includes a first portion 260 having a first doping concentration, a second portion 262 from Z1 to Z2 having a second doping concentration C2, and a third portion 264 from Z2 to Z3 having a third doping concentration C3. The first doping concentration C1 in the first portion 260 includes a doping profile that defines the N-well 252. The second doping concentration C2 in the second portion 262 is associated with the corresponding APT feature 248. The third doping concentration C3 in the third portion 264 is associated with a doping level to the respective channel region. The second portion 262 is doped through the solid phase diffusion and precise material modification. The third portion 264 is tuned by ion implantations. The first portion 260 is doped by ion implantation. In the present embodiment, the second doping concentration C2 is greater than the third doping concentration C3. Particularly, C2 is tuned to effectively eliminate or reduce the punch-through effect while C3 is tuned independently for proper threshold voltage and device performance.

The first portion 260 vertically spans within the bottom portion of the fin active region 216 and is laterally in contact to the dopant-containing dielectric material layer. In some embodiment, the first doping concentration C1 is greater than the third doping concentration C3 but less than the second doping concentration C2. In some other embodiments, various doping profile may have a doping distribution due to the respective doping process and the diffusion. For example, the first doping profile in the first portion 260 may have a doping profile with a varying doping concentration, such as one illustrated by the dashed curve 266.

Figure 17:
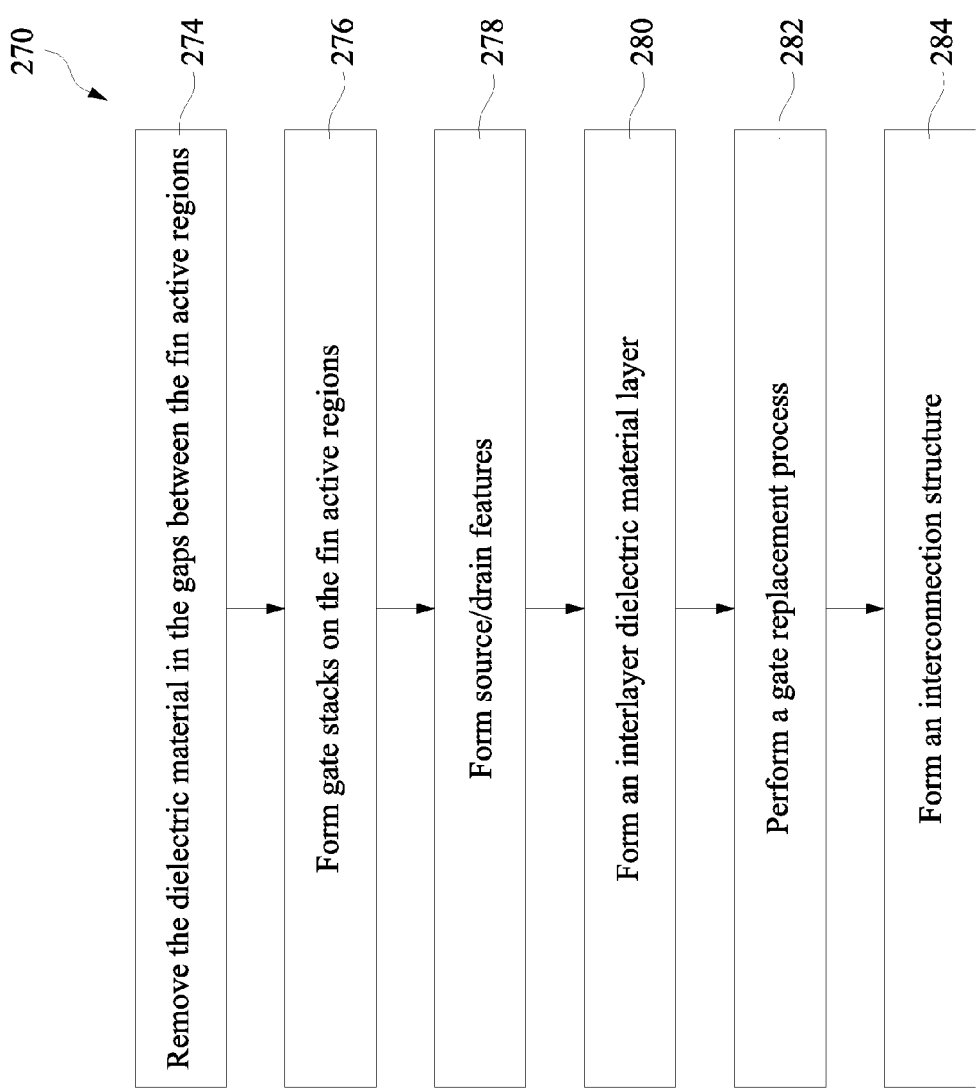
FIG. 17 is a flowchart of a method in accordance with some embodiments.

The method 100 may further include other operation 128 to form respective devices, such as PMOS transistor(s) in the PMOS region 212 and NMOS transistor(s) in the NMOS region 214. The operations 128 to form respective devices are further described with reference to FIG. 17 as a flowchart of a method 270 in accordance with some embodiments.

The method 270 includes an operation 274 by partially removing the dielectric material 246 in the gaps between the modified fin active regions 245 by a suitable technique, such as wet etch using hydrofluoric acid. Thereby, the modified fin active regions 245 are formed with an expected height that vertically spans from Z2 to Z3. The modified fin active regions 245 are exposed for subsequent fabrication operations. After the partial removal of the dielectric material 246, the remaining portions of the dielectric material 246 forms shallow trench isolation (STI) features in the substrate 210. In some other embodiments, the dielectric material 246 is completely removed, resulting in various trenches, and another dielectric material layer is filled in the bottom portions of the trenches to form STI features by a proper procedure.

The method 270 includes an operation 276 by forming gate stacks on the substrate 210. Specifically, the gate stacks are disposed over the modified fin active regions 245. The gate stacks include gate dielectric material (such as silicon oxide and/or high dielectric material) and gate electrode (such as polycrystalline silicon). The formation of the gate stacks includes depositions and patterning. The depositions of the gate stacks further include forming a gate dielectric material film on the fin active regions and forming a gate electrode material layer over the gate dielectric material layer. The patterning of the gate stacks includes lithography process and etching. The gate stacks formed at this stage may be replaced at late stage with different materials, such as metal for gate electrode and high k dielectric for gate dielectric.

The method 270 further includes an operation 278 by forming source and drain features. The formations of the source and drain features for NMOS devices and PMOS devices are separately implemented with respective dopants. In some embodiments, the source and drain features include lightly doped drain (LDD) features and heavily doped source and drain (S/D). A thermal annealing process may be applied to active the doped species.

The source and drain features may be formed by one or more ion implantations. The following description using the NMOS transistors as an example, and the formation of the source and drain features of MMOS transistors is similar. In some embodiments, the source and drain features for NMOS transistors are formed by an ion implantation procedure that includes a first ion implantation to form LDD features and a second ion implantation to form S/D features. In other embodiments, the formation of the gate stacks and the formation of the source and drain features are integrated in a collective procedure. In furtherance of the embodiments, the gate stacks are deposited and patterned; the first ion implantation is applied to the fin active regions to form LDD features; gate spacers are formed on sidewalls of the gate stacks by a suitable process (such as dielectric deposition and dry etching); and the second ion implantation is applied to the fin active regions to form S/D features.

In some embodiments, the source and drain features are formed on the epitaxy semiconductor materials to improve device performance, such as enhancing the carrier mobility. In furtherance of the embodiments, the formations of the source and drain features are provided below. The substrate within the source and drain areas is recessed by etching. Thereafter, an epitaxy growth is performed to refill the recessed areas with a proper semiconductor material different from that of the substrate. For example, silicon germanium (SiGe) is epitaxy grown in the recessed areas of the PMOS 212. Dopant may be introduced to the source and drain features by an in-situ process where the dopant is simultaneously introduced in the source and drain features during the epitaxy growth, such as by using precursor that additionally includes a dopant-containing chemical.

The method 270 further includes an operation 280 by forming an interlayer dielectric material (ILD) on the semiconductor structure 200. The ILD includes one or more dielectric materials, such as silicon oxide, a low k dielectric material or a combination thereof. In some embodiment, the formation of the ILD includes deposition and CMP.

The method 270 may include an operation 282 by performing a gate replacement process to replace the previously formed gate stacks with metal gate stacks different gate materials, such as a high-k dielectric layer for gate dielectric and metal for gate electrode. In some embodiments of the metal gate stacks, the gate dielectric includes an interfacial layer (such as silicon oxide) and a high k dielectric material layer (such as hafnium oxide) on the interfacial layer. The gate electrode includes one or more metal layer. In some embodiments, the gate electrode includes a respective metal film with a suitable work function, to minimize the threshold voltage of the corresponding field effect transistors. In furtherance of the embodiments, the metal film of the gate stacks in the PMOS region 212 and the metal film of the gate stacks in the NMOS region 214 are different. In some embodiments, the gate replacement process includes removing the previously formed gate stacks (all material layers or a subset thereof), deposition and CMP. Therefore, various devices are formed on the substrates, such as p-type fin field effect transistors (pFinFETs) in the PMOS region 212 and n-type fin field effect transistors (nFinFETs) in the NMOS region 214.

The method 270 includes an operation 284 to form a multilayer interconnection structure to couple various devices to form a functional circuit. The multilayer interconnection structure includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Figure 18:
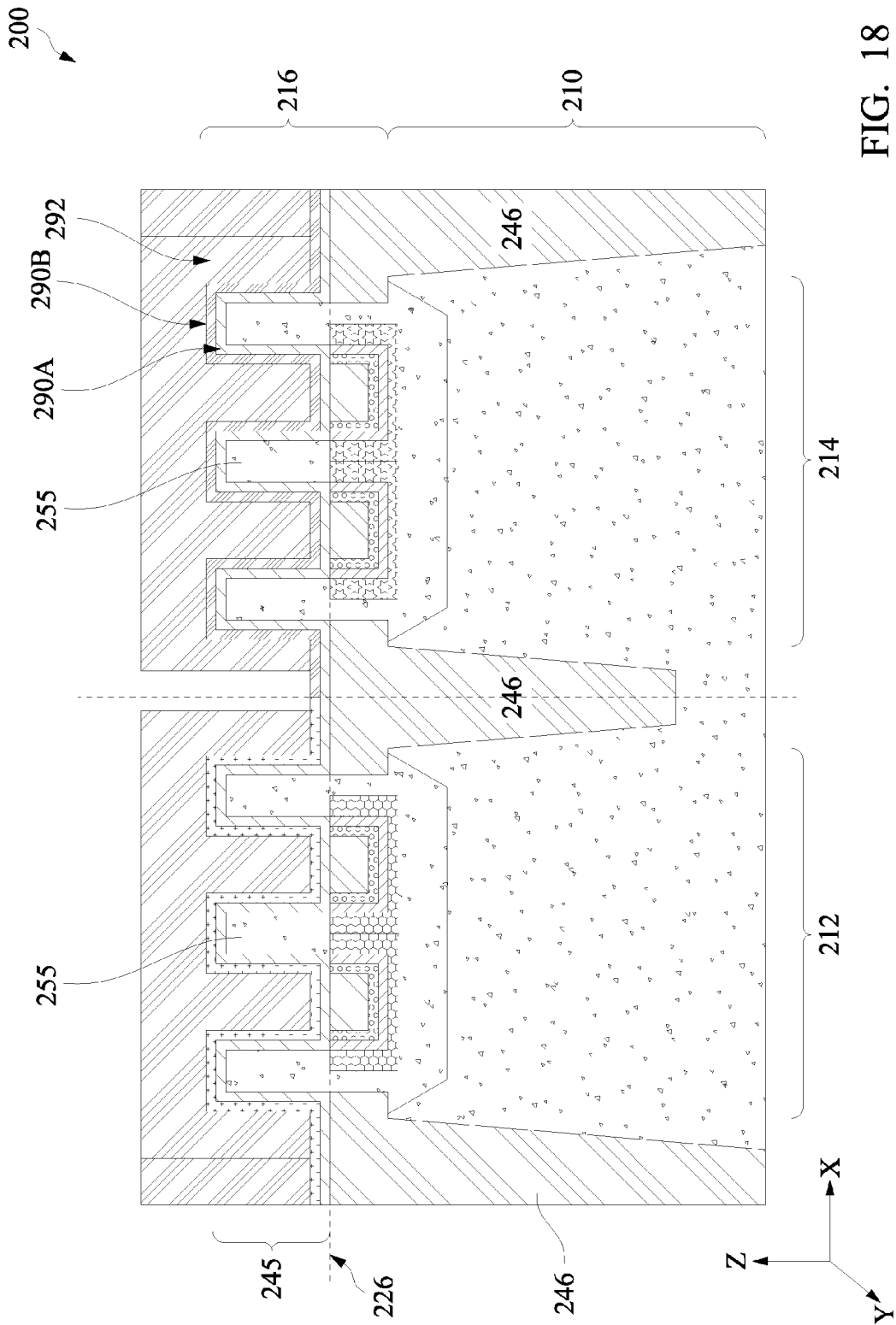
FIGS. 18 and 19 are diagrammatic sectional views of a semiconductor structure, constructed in accordance with some embodiments.
Figure 19:
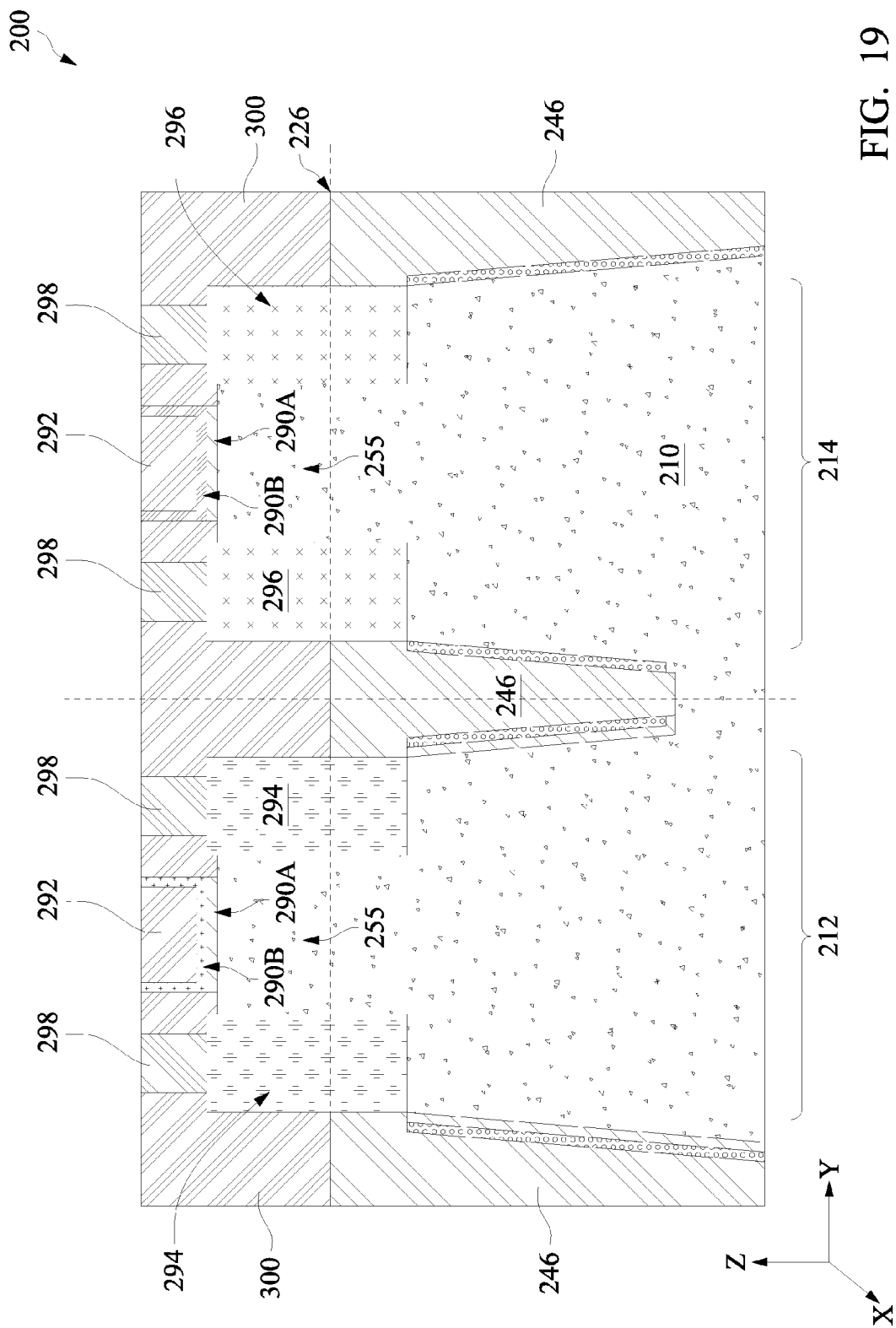

Thus formed semiconductor structure 200 is further described with reference to FIGS. 18 and 19 in accordance with some embodiments. FIG. 18 is sectional view of the semiconductor structure 200 (in portion) along the direction same to that of FIG. 15 but with additional features constructed in accordance with some embodiments. FIG. 19 is sectional view of the semiconductor structure 200 (in portion) along another direction perpendicular to the sectional direction of FIG. 18. Some features labeled in FIG. 15 are not labeled in FIGS. 18 and 19 for simplicity.

Referring to FIGS. 18 and 19, the semiconductor structure 200 includes pFinFETs in the PMOS region 212 and nFinFETs in the NMOS region 214. Each of the pFinFETs and nFinFETs includes respective gate, source and drain properly configured. Particularly, the semiconductor structure 200 includes gate stacks having gate dielectric 290 and gate electrode 292. In the present embodiment, the gate dielectric layer 290 includes an interfacial layer 290A (such as silicon oxide) and a high k dielectric material layer 290B (such as hafnium oxide). In some embodiments as described above, the gate electrodes to pFinFETs and the gate electrodes to nFinFETs include different materials for work function tuning and performance enhancement. For example, the gate electrodes to pFinFETs include titanium nitride and the gate electrodes to nFinFETs include tantalum. In other examples, the gate electrodes additionally include other conductive material, such as aluminum. The semiconductor structure 200 also includes source and drain features 294 in the PMOS region 212 and source and drain features 296 in the NMOS region 214 with opposite conductivity types. In some embodiments, epitaxy source and drain features of a different semiconductor material are employed to enhance the carrier mobility and the device performance. In one example, the source and drain features 294 in the PMOS region 212 include silicon germanium while the channel regions 255 and the substrate 210 include silicon. In another example, the source and drain features 296 in the NMOS region 214 include silicon carbide while the channel regions 255 and the substrate 210 include silicon. The epitaxy source and drain features are formed by a proper procedure, such as a procedure that includes etching to recess the corresponding source and drain regions, and epitaxy growing a different semiconductor material in the recessed source and drain regions. The channel regions are portions of the fin features surrounded by the gate stacks and are coupled with corresponding source/drain features. The semiconductor structure 200 further includes contact features 298 to couple the underlying source and drain features to the overlying interconnect structure (not shown), and further includes isolation features 300 to isolate various conductive features from each other. In some embodiments, the contact features 298 include tungsten or other suitable metal. In some embodiments, the isolation features 300 include a dielectric material, such as silicon oxide, low k dielectric material or a combination thereof.

Other alternatives or embodiments may present without departure from the spirit and scope of the present disclosure. In some embodiments, patterning of the SiN layer 238 may be achieved by other suitable procedure. For example, a flowable material (such as photoresist material) is coated on the semiconductor structure and recessed (by lithography patterning or etching), thereby, the top portion of the SiN layer 238 is uncovered and can be used as an etch mask to selectively remove the top portions of the dopant-coating dielectric materials. In this case, the SiN layer may be replaced by other suitable dielectric material that can be patterned and used as an etch mask during the patterning of the dopant-containing dielectric material layer.

The present disclosure provides a semiconductor structure and a method making the same. The semiconductor structure includes FETs formed on fin active regions and a doping profile with enhanced device performance. Particularly, the semiconductor structure includes a fin active region formed on a semiconductor substrate; a channel region of a first type conductivity, formed in the fin active region and having a first carrier concentration; and an APT feature of the first type conductivity formed in the semiconductor substrate and underlying the channel region. The APT feature has a second carrier concentration greater than the first carrier concentration. The method uses PPM process and FCVD according to some embodiments.

The embodiments of the present disclosure offer advantages over existing art, though it is understood that other embodiments may offer different advantages, not all advantages are necessarily discussed herein, and that no particular advantage is required for all embodiments. By utilizing the disclosed method and structure, APT feature is formed on the bottom portion of the fin active region and is extended into the substrate. The carrier concentration of the APT feature is independently tuned to prevent the punch-through effect without degrading the carrier concentration of the channel region. By using PPM process, the dopant-containing dielectric material is patterned cost-effectively without utilizing additional lithography patterning.

Thus, the present disclosure provides a semiconductor structure in accordance with some embodiments. The semiconductor structure includes a fin active region formed on a semiconductor substrate; a channel region of a first type conductivity, defined in the fin active region and having a first carrier concentration; and an anti-punch through (APT) feature of the first type conductivity, wherein the APT feature is formed in the semiconductor substrate, is directly underlying the channel region, and has a second carrier concentration greater than the first carrier concentration.

The present disclosure also provides a semiconductor structure in accordance with some other embodiments. The semiconductor structure includes first fin semiconductor features formed on a semiconductor substrate; and a first dopant-containing dielectric material feature formed on the semiconductor substrate and disposed on sidewalls of the first fin semiconductor features. The first fin semiconductor features have a first type conductivity. The first dopant-containing dielectric material feature includes a dielectric material containing dopant of a first type dopant.

The present disclosure provides a method in accordance with some embodiments. The method includes forming fin semiconductor features on a substrate; forming a dopant-containing dielectric material layer on sidewalls of the fin semiconductor features and the substrate; and removing a top portion of the dopant-containing dielectric material layer. A bottom portion of the dopant-containing dielectric material layer remains as a solid diffusion source to introduce a first type dopant to bottom portions of the fin semiconductor features and the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a fin active region including a first fin element and a second fin element formed on a semiconductor substrate;
   a channel region of a first type conductivity, defined in the fin active region and having a first carrier concentration; and
   an anti-punch through (APT) feature of the first type conductivity, wherein the APT feature is formed in the semiconductor substrate, and is underlying the channel region,
   wherein the APT feature has a second carrier concentration greater than the first carrier concentration, and continuously extends from a first sidewall of the first fin element to a second sidewall of the second fin element; and
   a first dielectric material feature formed on the semiconductor substrate and disposed on sidewalls of the first and second fin elements, wherein the first dielectric material feature includes:
   a dopant-containing silicate glass layer including a first type dopant formed over the semiconductor substrate; and
   an un-doped silicate glass layer over the dopant-containing silicate glass layer, wherein a top surface of the un-doped silicate glass layer has a concave profile.

2. The semiconductor structure of claim 1, further comprising a doped well of the first type conductivity, wherein the doped well is formed in the semiconductor substrate, is underlying the APT feature, and has a third carrier concentration greater than the first carrier concentration and less than the second carrier concentration.

3. The semiconductor structure of claim 1, wherein the first dielectric material feature is disposed laterally in contact with the APT feature.

4. The semiconductor structure of claim 1, wherein the dopant-containing silicate glass layer has a doping concentration ranging from about $1 \times 10^{21}$ $cm^{-3}$ to about $8 \times 10^{21}$ $cm^{-3}$.

5. The semiconductor structure of claim 1, wherein the dopant-containing silicate glass layer includes a phosphosilicate glass (PSG) material layer, and
   wherein the un-doped silicate glass layer includes an un-doped silicate glass (USG) material layer.

6. The semiconductor structure of claim 5, wherein the PSG and USG material layers are U-shaped and are configured between the APT feature and another APT feature formed in an adjacent fin active region.

7. The semiconductor structure of claim 5, further comprising a p-type field effect transistor (pFET) formed on the fin active region, wherein the pFET includes a gate stack disposed on sidewalls of the fin active region.

8. The semiconductor structure of claim 7, wherein
the pFET further includes source and drain features of a p-type dopant;
the fin active region includes a silicon fin active region; and
the source and drain features include silicon germanium.

9. The semiconductor structure of claim 1, wherein the dopant-containing silicate glass layer includes a borosilicate glass (BSG) material layer, and
wherein the un-doped silicate glass layer includes an un-doped silicate glass (USG) material layer.

10. The semiconductor structure of claim 1, wherein the fin active region includes a third fin element, and
wherein at least a portion of the APT feature continuously extends from a third sidewall of the second fin element to a fourth sidewall of the third fin element.

11. The semiconductor structure of claim 1, wherein the fin active region includes a third fin element, further comprising:
a second APT feature continuously extends from a third sidewall of the second fin element to a fourth sidewall of the third fin element.

12. A semiconductor structure comprising:
first fin semiconductor features having a first type conductivity formed on a semiconductor substrate, wherein each of the first fin semiconductor features includes a top portion having a first carrier concentration and a bottom portion having a second carrier concentration greater than the first carrier concentration;
an anti-punch through (APT) feature including the bottom portions of two adjacent fin semiconductor features of the first fin semiconductor features; and
a first dielectric material feature formed on the semiconductor substrate and disposed on sidewalls of the first fin semiconductor features, wherein the first dielectric material feature includes:
a dopant-containing silicate glass layer including a first type dopant formed over the semiconductor substrate; and
an un-doped silicate glass layer over the dopant-containing silicate glass layer, wherein a top surface of the un-doped silicate glass layer has a concave profile.

13. The semiconductor structure of claim 12, wherein an interface between the top and bottom portions is coplanar to a top surface of the first dielectric material feature.

14. The semiconductor structure of claim 12, wherein the dopant-containing silicate glass layer has a U-shape;
wherein the un-doped silicate glass layer has a U-shape; and
wherein a second dielectric material feature extends from a first sidewall of the un-doped silicate glass layer and a second sidewall of the un-doped silicate glass layer.

15. The semiconductor structure of claim 12, further comprising:
second fin semiconductor features formed on the semiconductor substrate; and
a second dielectric material feature formed on the semiconductor substrate and disposed on sidewalls of the second fin semiconductor features, wherein
the second fin semiconductor features are doped with a second type conductivity being opposite to the first type conductivity, and
the second dielectric material feature include a second type dopant being opposite to the first type dopant.

16. The semiconductor structure of claim 12, wherein the continuous APT feature is U-shaped.

17. A device comprising:
a substrate;
a plurality of fin semiconductor features above the substrate;
a first dielectric material layer on sidewalls of the fin semiconductor features and the substrate, wherein the first dielectric material layer includes:
a dopant-containing silicate glass layer formed over the substrate; and
an un-doped silicate glass layer disposed over the dopant-containing silicate glass layer and having a top surface having a concave profile;
wherein the plurality of fin semiconductor features and the dopant-containing silicate glass layer include a common first-type dopant, but at different concentrations; and
a second dielectric material layer having a bottom surface interfacing with the concave profile of the un-doped silicate glass layer; and
anti-punch-through (APT) features with an APT carrier concentration greater than a channel carrier concentration of channel regions of the plurality of fin semiconductor features,
wherein a first APT feature of the APT features continuously extends from a first sidewall of a first fin semiconductor feature to a second sidewall of a second fin semiconductor feature of the plurality of fin semiconductor features, and
wherein a second APT feature of the APT features continuously extends from a third sidewall of the second fin semiconductor feature to a fourth sidewall of a third fin semiconductor feature of the plurality of fin semiconductor features.

18. The device of claim 17, wherein the dopant-containing silicate glass layer includes one of a phosphosilicate glass (PSG) layer and a borosilicate glass (BSG) layer.

19. The device of claim 17, wherein
the substrate includes a doped well of a first type conductivity with a well carrier concentration,
wherein the channel carrier concentration is less than the well carrier concentration, and
wherein the APT carrier concentration is greater than the well carrier concentration.

20. The device of claim 17, further comprising:
a gate dielectric material layer disposed over the second dielectric material layer.

* * * * *